United States Patent
Song et al.

(10) Patent No.: US 12,289,888 B2
(45) Date of Patent: Apr. 29, 2025

(54) MEMORY DEVICE

(71) Applicant: SAMSUNG ELECTRONICS CO., LTD., Suwon-si (KR)

(72) Inventors: Seungmin Song, Seoul (KR);
Beyounghyun Koh, Seoul (KR);
Yongjin Kwon, Yongin-si (KR);
Kangmin Kim, Hwaseong-si (KR);
Jaehoon Shin, Suwon-si (KR);
Joongshik Shin, Yongin-si (KR);
Sungsoo Ahn, Hwaseong-si (KR);
Seunghwan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 441 days.

(21) Appl. No.: 17/878,304

(22) Filed: Aug. 1, 2022

(65) Prior Publication Data
US 2022/0367513 A1 Nov. 17, 2022

Related U.S. Application Data

(63) Continuation of application No. 16/895,364, filed on Jun. 8, 2020, now Pat. No. 11,430,808.

(30) Foreign Application Priority Data

Oct. 10, 2019 (KR) .................. 10-2019-0125694

(51) Int. Cl.
*H10B 43/27* (2023.01)
*H10B 43/10* (2023.01)
(Continued)

(52) U.S. Cl.
CPC ............. *H10B 43/27* (2023.02); *H10B 43/10* (2023.02); *H10B 43/35* (2023.02); *H10B 43/40* (2023.02)

(58) Field of Classification Search
CPC ................ H10B 43/27; H10B 43/20
See application file for complete search history.

(56) References Cited

U.S. PATENT DOCUMENTS

| 9,640,549 B2 | 5/2017 | Lee et al. |
| 10,202,910 B2 | 2/2019 | Leone et al. |

(Continued)

FOREIGN PATENT DOCUMENTS

| KR | 1020150126524 A | 11/2015 |
| KR | 10-2018-0138380 A | 12/2018 |

OTHER PUBLICATIONS

Office Action issued Jan. 31, 2024 from the Korean Intellectual Property Office for corresponding KR Patent Application No. 10-2019-0125694.

(Continued)

*Primary Examiner* — Christopher A Johnson
(74) *Attorney, Agent, or Firm* — Muir Patent Law, PLLC

(57) ABSTRACT

A memory device includes a substrate; a stacked structure including a plurality of gate layers and a plurality of interlayer insulating layers that are alternately stacked on the substrate in a vertical direction, the stacked structure including a row of cutouts, each of the cutouts extending in a first horizontal direction and being configured to cut the plurality of gate layers, the cutouts being apart from each other and arranged in a cell region of the stacked structure in the first horizontal direction; and a row of channel structures, the channel structures being arranged in the cell region in the first horizontal direction, each of the channel structures extending in the vertical direction to penetrate the plurality of gate layers.

20 Claims, 27 Drawing Sheets

(51) Int. Cl.
*H10B 43/35* (2023.01)
*H10B 43/40* (2023.01)

(56) References Cited

U.S. PATENT DOCUMENTS

| | | |
|---|---|---|
| 10,515,974 B2 | 12/2019 | Lee et al. |
| 2015/0137216 A1* | 5/2015 | Lee .................... H01L 29/7889 |
| | | 257/329 |
| 2015/0318301 A1 | 11/2015 | Lee et al. |
| 2016/0049419 A1 | 2/2016 | Lee et al. |
| 2017/0104000 A1 | 4/2017 | Park et al. |
| 2017/0301684 A1 | 10/2017 | Park et al. |
| 2017/0352683 A1 | 12/2017 | Lee |
| 2018/0026047 A1 | 1/2018 | Park et al. |
| 2018/0097012 A1 | 4/2018 | Lee et al. |
| 2018/0130814 A1 | 5/2018 | Lee |
| 2018/0277556 A1 | 9/2018 | Kang |
| 2018/0374862 A1 | 12/2018 | Lee et al. |
| 2019/0067182 A1 | 2/2019 | Lee |
| 2019/0115356 A1 | 4/2019 | Lee |
| 2019/0115363 A1 | 4/2019 | Choi |
| 2019/0172840 A1 | 6/2019 | Song et al. |
| 2019/0214404 A1 | 7/2019 | Ahn et al. |

OTHER PUBLICATIONS

First Office Action issued Jul. 16, 2024 by the Japanese Patent Office for corresponding JP Patent Application No. 2020-143873.
German Office action dated Apr. 12, 2022.
Notice of Allowance dated Oct. 15, 2024 for corresponding KR Patent Application No. 10-2019-0125694.

* cited by examiner

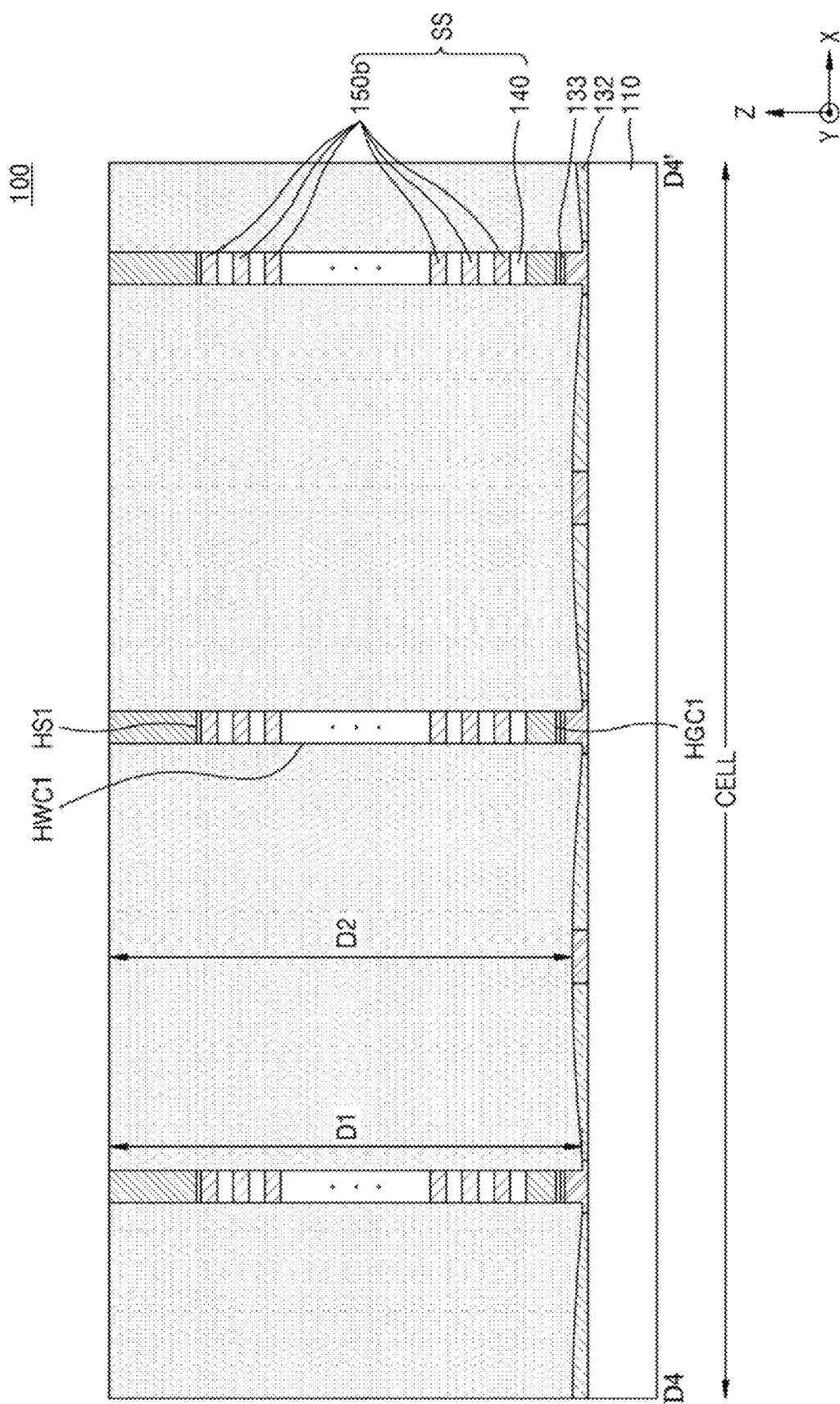

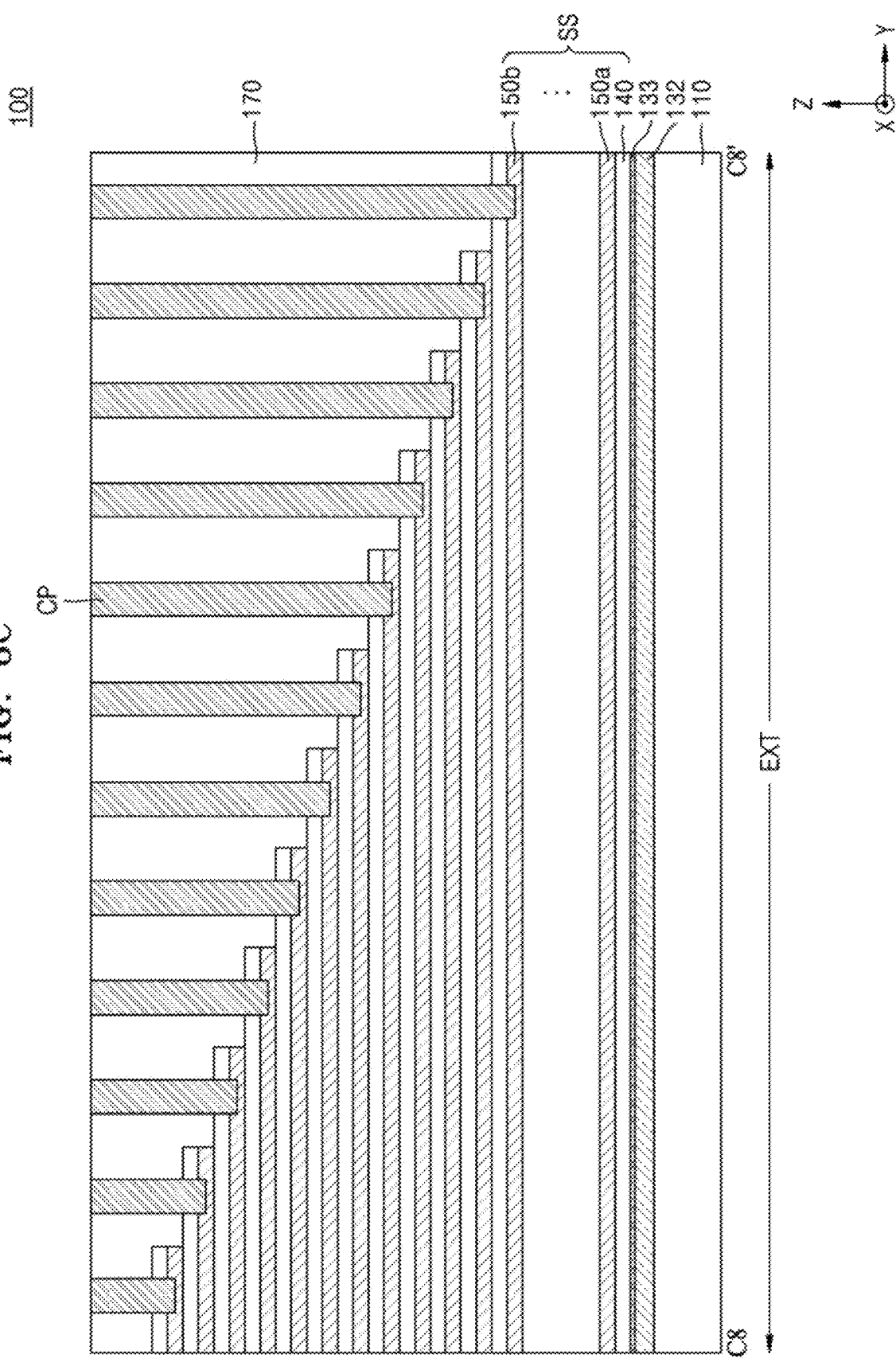

MEMORY DEVICE

CROSS-REFERENCE TO RELATED APPLICATIONS

This is application is a continuation of pending U.S. application Ser. No. 16/895,364, filed on Jun. 8, 2020, the entire contents of which are hereby incorporated by reference.

Korean Patent Application No. 10-2019-0125694, filed on Oct. 10, 2019, in the Korean Intellectual Property Office, and entitled: "Memory Device," is incorporated by reference herein in its entirety.

BACKGROUND

1. Field

Embodiments relate to a semiconductor memory device.

2. Description of the Related Art

Electronic devices are being developed to have smaller sizes, handle larger volumes of data, and have lower cost. For example, memory devices may be formed with a higher degree of integration.

SUMMARY

Embodiments are directed to a memory device, including a substrate; a stacked structure including a plurality of gate layers and a plurality of interlayer insulating layers that are alternately stacked on the substrate in a vertical direction, the stacked structure including a row of cutouts, each of the cutouts extending in a first horizontal direction and being configured to cut the plurality of gate layers, the cutouts being apart from each other and arranged in a cell region of the stacked structure in the first horizontal direction; and a row of channel structures, the channel structures being arranged in the cell region in the first horizontal direction, each of the channel structures extending in the vertical direction to penetrate the plurality of gate layers.

Embodiments are directed to a memory device, including a substrate; a stacked structure including a plurality of gate layers and a plurality of interlayer insulating layers that are alternately stacked on the substrate in a vertical direction; and channel structures arranged in a cell region of the stacked structure in a first row, a second row, and a third row that extend in a first horizontal direction, the channel structures each extending in the vertical direction to penetrate the plurality of gate layers. The stacked structure may include a first row of discontinuous cutouts that discontinuously cut the plurality of gate layers in the first horizontal direction between the first row of channel structures and the second row of the channel structures in the cell region; and continuous cutouts that continuously cut the plurality of gate layers in the first horizontal direction in the cell region. The second and third rows of the channel structures may be between the first row of discontinuous cutouts and the continuous cutouts.

Embodiments are directed to a memory device, including a substrate; a stacked structure including a plurality of gate layers and a plurality of interlayer insulating layers that are alternately stacked on the substrate in a vertical direction; and a plurality of channel structures in a cell region of the stacked structure, the channel structures extending in the vertical direction to penetrate the plurality of gate layers. The stacked structure may include a row of cell region cutouts, each of the cell region cutouts extending in a first horizontal direction and cutting the plurality of gate layers, the cell region cutouts may be spaced apart from each other and are arranged in the first horizontal direction in the cell region, the stacked structure may include a row of connection region cutouts, each of the connection region cutouts extending in the first horizontal direction and cutting the plurality of gate layers, and the connection region cutouts may be spaced apart from each other and are arranged in the first horizontal direction in a connection region.

BRIEF DESCRIPTION OF THE DRAWINGS

Features will become apparent to those of skill in the art by describing in detail example embodiments with reference to the attached drawings in which:

FIG. 4D is a cross-sectional view taken along line D4-D4' illustrated in FIG. 4A;

FIG. 8C is a cross-sectional view taken along line C8-C8' illustrated in FIG. 8A;

DETAILED DESCRIPTION

Figure 1:
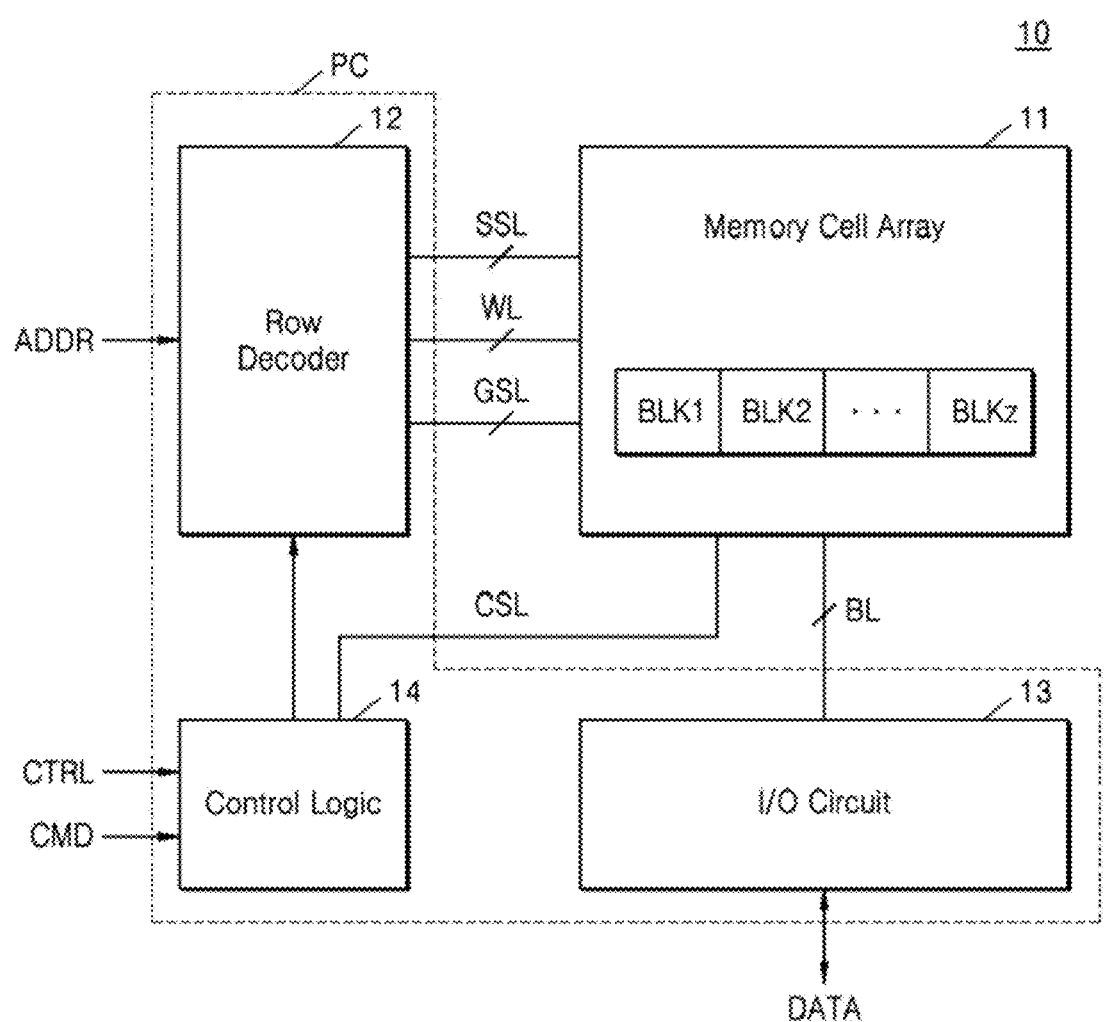
FIG. 1 is a circuit diagram illustrating a memory device according to an example embodiment.

FIG. 1 is a circuit diagram illustrating a memory device 10 according to an example embodiment.

Referring to FIG. 1, the memory device 10 may include a memory cell array 11 and a peripheral circuit PC. The peripheral circuit PC may include a row decoder 12, an input/output (I/O) circuit 13, and a control logic 14.

The memory cell array 11 may include first through $z^{th}$ memory blocks BLK1 through BLKz (z is an integer of 2 or more). Each of the first through $z^{th}$ memory blocks BLK1 through BLKz may include a plurality of memory cells capable of storing data. The plurality of memory cells included in the memory cell array 11 may be nonvolatile memory cells that maintain data stored therein even when supplied power is interrupted. For example, the memory cell array 11 may include an electrically erasable programmable read-only memory (RAM) (EEPROM), a flash memory, phase change RAM (PRAM), resistance RAM (RRAM), and magnetic RAM (MRAM), or ferroelectric RAM (FRAM). Below, example embodiments are described for the case in which the plurality of memory cells include NAND flash memory cells.

The row decoder 12 may be connected to the memory cell array 11 via a plurality of string selection lines SSL, a plurality of word lines WL, and a plurality of ground selection lines GSL. The row decoder 12 may select at least one of the first through $z^{th}$ memory blocks BLK1 through BLKz of the memory cell array 11 in response to an address ADDR provided from a memory controller (not illustrated). The row decoder 12 may select at least one of the word lines WL, the string selection lines SSL, and the ground selection lines GSL of a memory block that is selected in response to the address ADDR provided from a memory controller (not illustrated).

The I/O circuit 13 may be connected to the memory cell array 11 via a plurality of bit lines BL. The I/O circuit 13 may select at least one of the plurality of bit lines BL. The I/O circuit 13 may store data DATA received from the memory controller in the memory cell array 11. In addition, the I/O circuit 13 may output data DATA read from the memory cell array 11 to the memory controller.

The control logic 14 may control an overall operation of the memory device 10. The control logic 14 may control operations of the row decoder 12 and the I/O circuit 13. For example, the memory device 10 may be controlled to perform a memory operation corresponding to a command CMD provided from the memory controller. In addition, the control logic 14 may generate various internal control signals used in the memory device 10 in response to a control signal CTRL provided from the memory controller.

Figure 2:
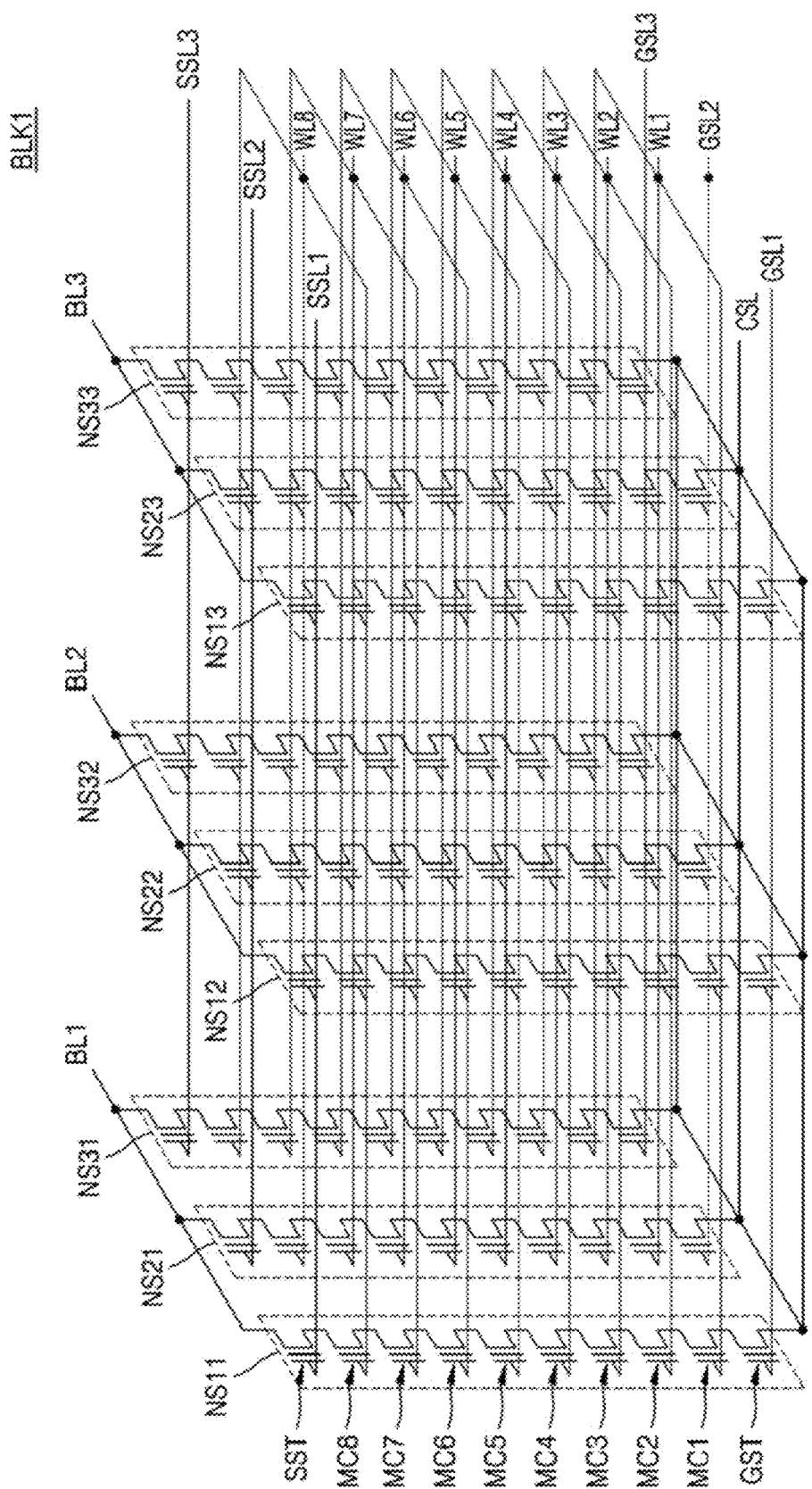
FIG. 2 is a circuit diagram schematically illustrating one of memory blocks constituting a memory cell array included in a memory device, according to an example embodiment.

FIG. 2 is a circuit diagram schematically illustrating the first block BLK1 that is one of the memory blocks constituting the memory cell array 11 (refer to FIG. 1) included in the memory device 10 (refer to FIG. 1), according to an example embodiment.

Referring to FIG. 2, the first memory block BLK1 may include a plurality of NAND strings (NS11 through NS33). In FIG. 2, one memory block (BLK1) is illustrated to include nine NAND strings (NS11 through NS33), but the number of NAND strings included in one memory block (BLK1) may be varied. Each of the NAND strings (NS11 through NS33) may include at least one string selection transistor SST, a plurality of memory cells (MC1 through MC8), and at least one ground selection transistor GST that are connected in series. In FIG. 2, each of the NAND strings (NS11 through NS33) is illustrated to include one string selection transistor SST, eight memory cells (MC1 through MC8), and one ground selection transistor GST, but the numbers of string selection transistors SST, memory cells, and ground selection transistors GST included in each of the NAND strings (NS11 through NS33) may be varied.

The NAND strings (NS11 through NS33) may be connected between bit lines (BL1 through BL3) and a common source line CSL. Gates of the string select transistors SST may be connected to the string selection lines (SSL1 through SSL3), gates of the memory cells (MC1 through MC8) may be connected to the word lines (WL1 through WL8), and gates of the ground selection transistors GST may be connected to the ground selection lines (GSL1 through GSL3). The common source line CSL may be commonly connected to the plurality of NAND strings (NS11 through NS33). In addition, the word lines (WL1 through WL8) may be commonly connected to the plurality of NAND strings (NS11 through NS33).

Figure 3:
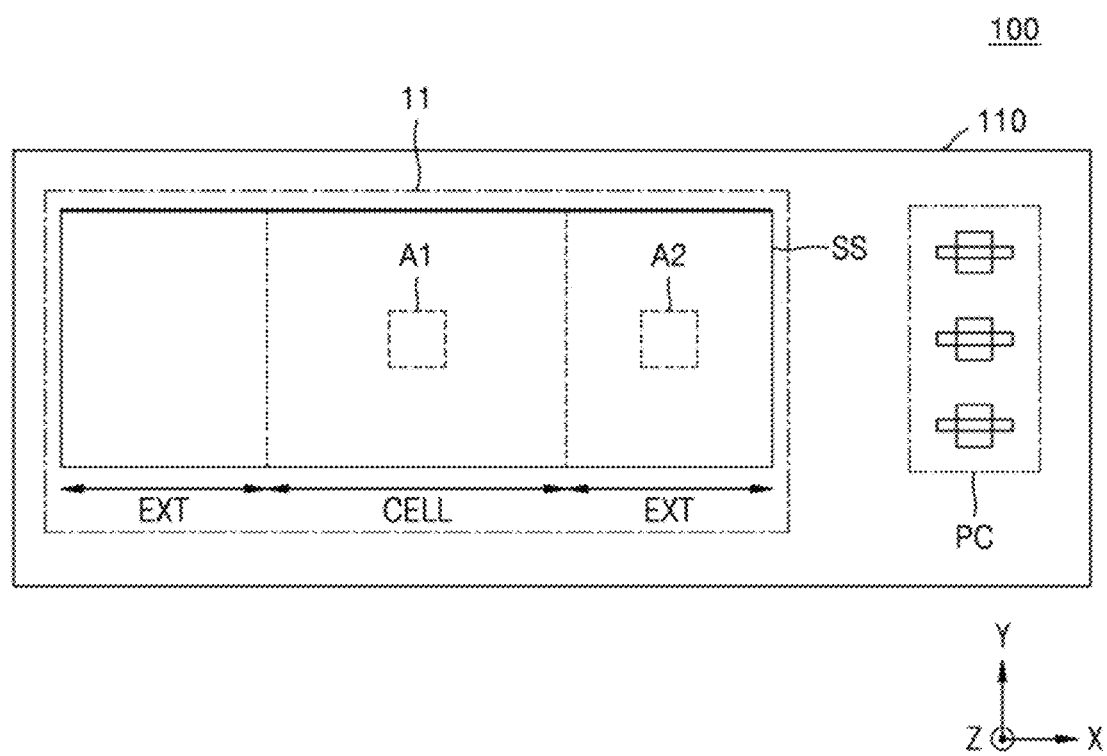
FIG. 3 is a plan view schematically illustrating a memory device according to an example embodiment.

FIG. 3 is a plan view schematically illustrating a memory device 100 according to an example embodiment.

Referring to FIG. 3, the memory device 100 may include a substrate 110, the memory cell array 11, and the peripheral circuit PC arranged side-by-side on the substrate 110. The memory cell array 11 may include a stacked structure SS on the substrate 110. The stacked structure SS may include a cell region CELL and a connection region EXT. The connection region EXT may be located at one side of the cell region CELL. The connection region EXT may be arranged along with the cell region CELL in a first horizontal direction (X direction). In an example embodiment, the stacked structure SS may have another connection region EXT. For example, two connection regions EXT may be located on opposite sides of the cell region CELL, respectively. The two connection regions EXT and the cell region CELL may be arranged in the first horizontal direction (X direction). The two connection regions EXT may be spaced apart from each other in the first horizontal direction (X direction), and the cell region CELL may be located between the two connection regions EXT. In an example embodiment, the stacked structure SS may include four connection regions EXT respectively located on four sides of the cell region CELL.

Figure 4A:
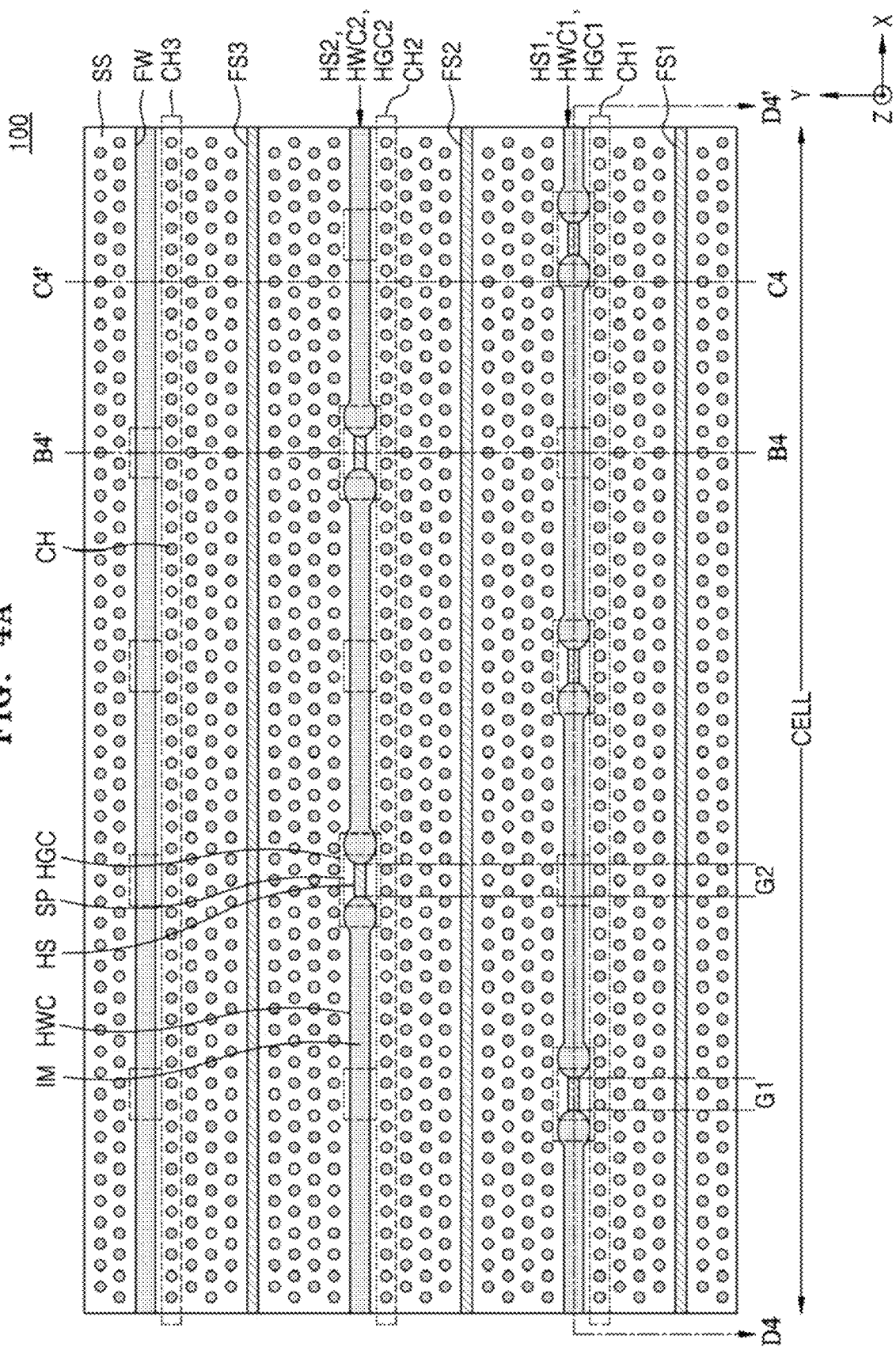
FIG. 4A is a plan view schematically illustrating a first area A1 illustrated in FIG. 3.
Figure 4B:
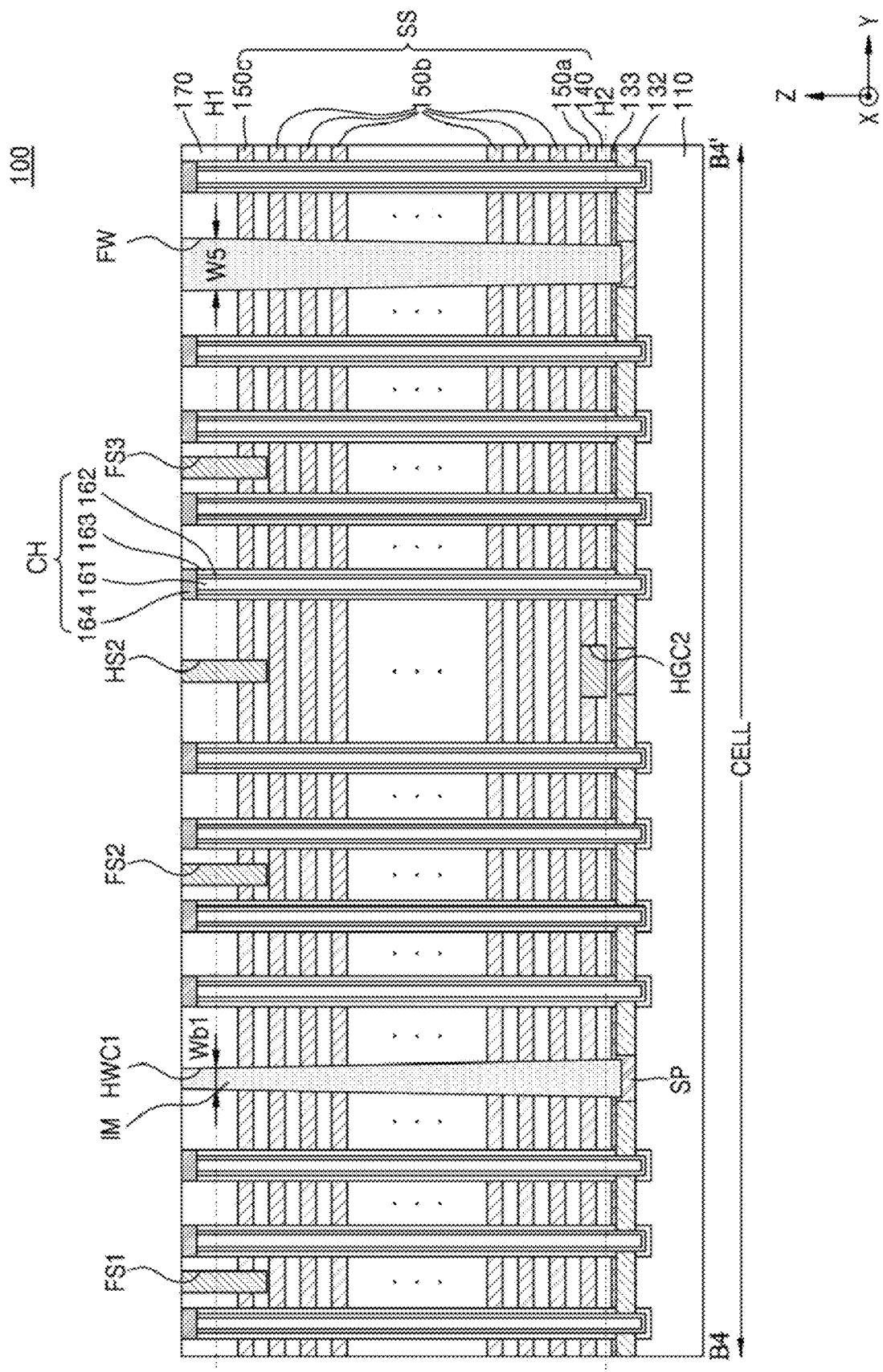
FIG. 4B is a cross-sectional view taken along line B4-B4' illustrated in FIG. 4A.
Figure 4C:
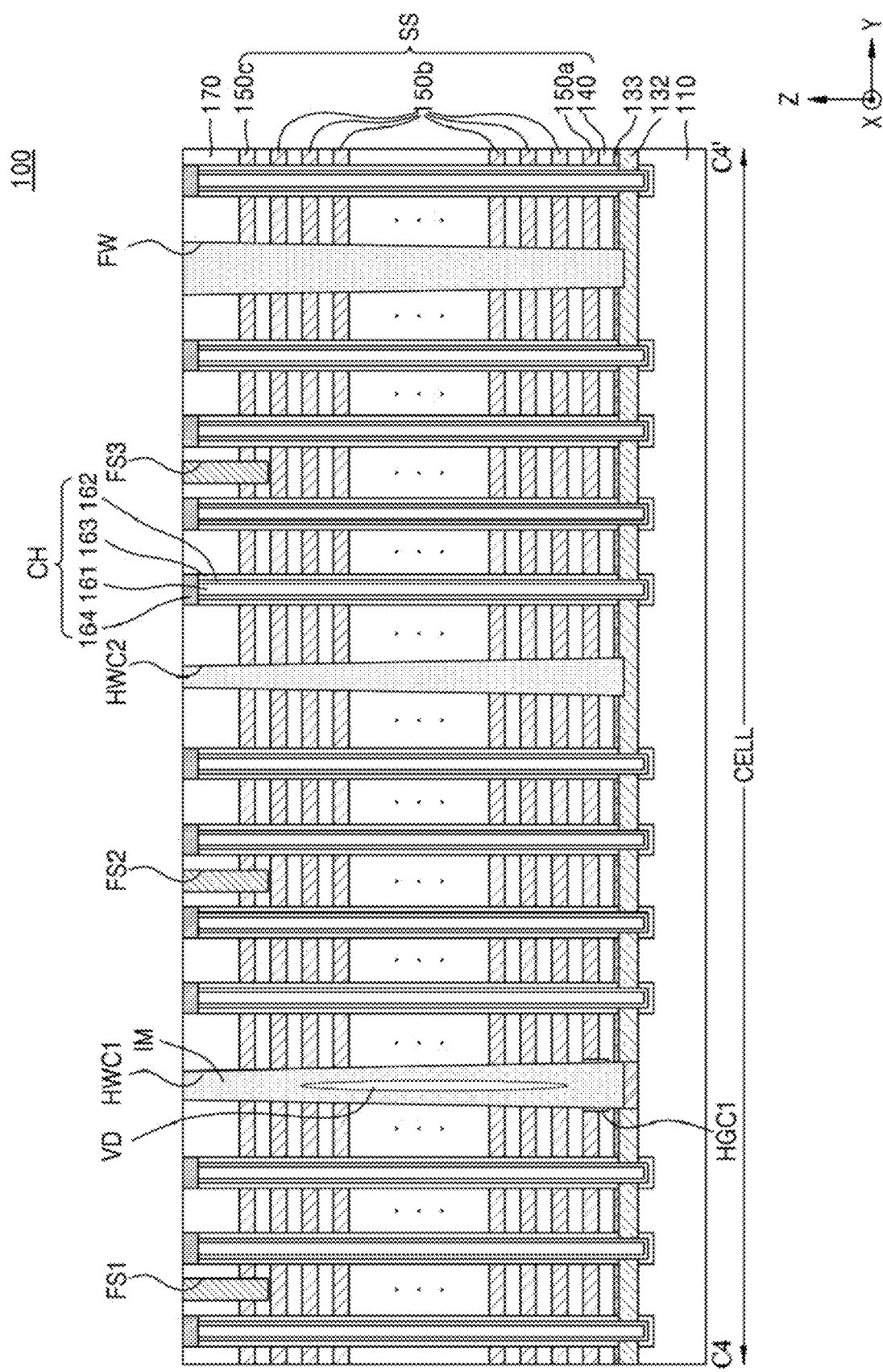
FIG. 4C is a cross-sectional view taken along line C4-C4' illustrated in FIG. 4A.
Figure 8A:
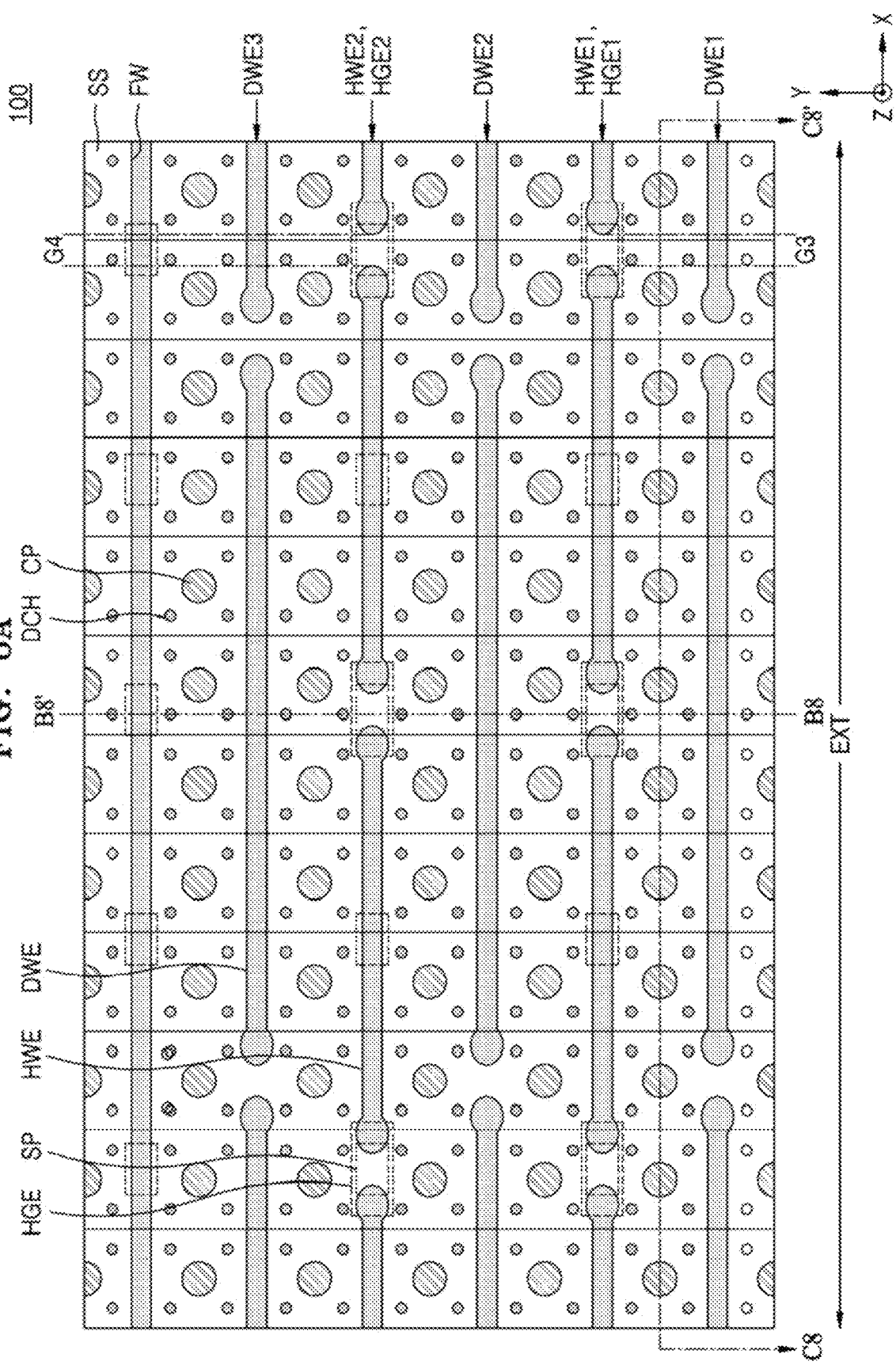
FIG. 8A is a plan view schematically illustrating a second area A2 illustrated in FIG. 3.
Figure 8B:
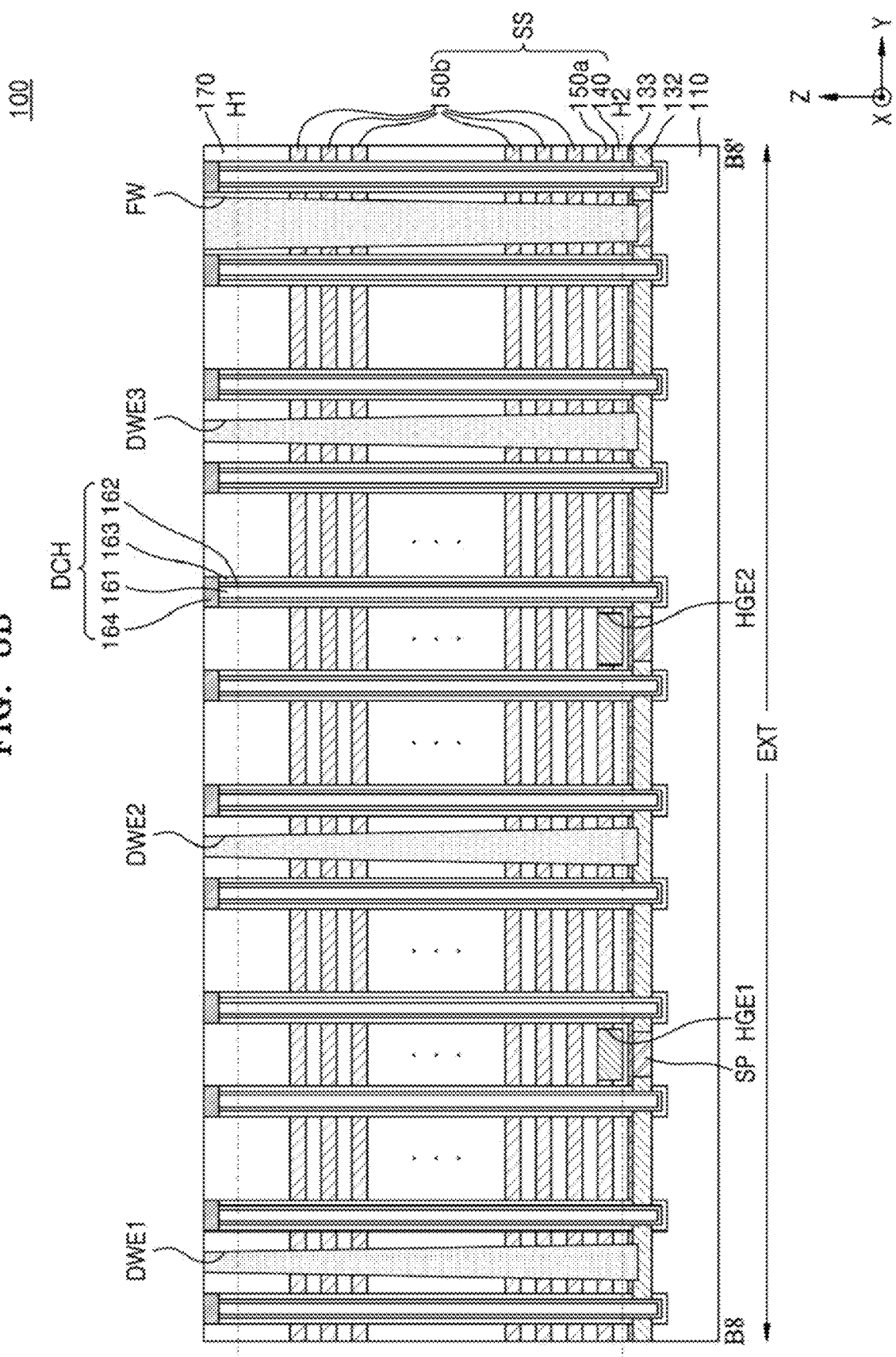
FIG. 8B is a cross-sectional view taken along line B8-B8' illustrated in FIG. 8A.

FIG. 4A is a plan view schematically illustrating a first area A1 illustrated in FIG. 3. FIG. 4B is a cross-sectional view taken along line B4-B4' illustrated in FIG. 4A. FIG. 4C is a cross-sectional view taken along line C4-C4' illustrated in FIG. 4A. FIG. 4D is a cross-sectional view taken along line D4-D4' illustrated in FIG. 4A. FIG. 8A is a plan view schematically illustrating a second area A2 illustrated in FIG. 3. FIG. 8B is a cross-sectional view taken along line B8-B8' illustrated in FIG. 8A. FIG. 8C is a cross-sectional view taken along line C8-C8' illustrated in FIG. 8A.

Referring to FIGS. 4A through 4D and 8A through 8C, the memory device 100 may include the substrate 110, the stacked structure SS on the substrate 110, a plurality of channel structures CH penetrating the cell region CELL of the stacked structure SS, and a plurality of dummy channel structures DCH penetrating the connection region EXT of the stacked structure SS.

The substrate 110 may include a semiconductor material such as a group IV semiconductor material, a group III-V semiconductor material, a group II-VI semiconductor material, or a combination thereof. The group IV semiconductor material may include, for example, silicon (Si), germanium (Ge), Si—Ge, or a combination thereof. The group III-V semiconductor material may include, for example, gallium arsenide (GaAs), indium phosphorus (InP), gallium phosphorus (GaP), indium arsenic (InAs), indium antimony (InSb), indium gallium arsenide (InGaAs), or a combination thereof. The group II-VI semiconductor material may include, for example, zinc telluride (ZnTe), cadmium sulfide (CdS), or a combination thereof.

The stacked structure SS may include a plurality of gate layers (150a through 150c) and a plurality of interlayer insulating layers 140 that are alternately stacked on the substrate 110. Two neighboring gate layers of the plurality of gate layers (150a through 150c) may be spaced apart from each other by one interlayer insulating layer 140. The plurality of gate layers (150a through 150c) may include at least one bottom gate layer 150a, a plurality of intermediate gate layers 150b on the at least one bottom gate layer 150a, and at least one top gate layer 150c on the plurality of intermediate gate layers 150b. Each of the gate layers (150a through 150c) may include a conductive material such as tungsten (W), copper (Cu), silver (Ag), gold (Au), aluminum (Al), or a combination thereof. Each interlayer insulating layer 140 may include an insulating material such as silicon oxide, silicon nitride, or a combination thereof.

As illustrated in FIGS. 4B and 4C, the cell region CELL of the stacked structure SS may be flat while, as illustrated in FIG. 8C, the connection area EXT of the stacked structure SS may have a stepped shape. Thus, a length in a second horizontal direction (Y direction) of a gate layer located at a lower height among the plurality of gate layers (150a through 150c) may be greater than a length in the second horizontal direction (Y direction) of a gate layer located at a greater height among the plurality of gate layers (150a through 150c). Similarly, a length in the second horizontal direction (Y direction) of an interlayer insulating layer 140 located at a lower height may be greater than a length in the second horizontal direction (Y direction) of an interlayer insulating layer 140 located at a greater height.

The channel structure CH may extend in a direction substantially parallel with a vertical direction (Z direction) and may penetrate the cell region CELL of the stacked structure SS. The dummy channel structure DCH may extend in a direction substantially parallel with the vertical direction (Z direction) and may penetrate the connection region EXT of the stacked structure SS. The directions in which the channel structure CH and/or the dummy channel structure DCH extend may not be perfectly parallel with the vertical direction (Z direction), for example, due to internal stress or deformation (for example, expansion, contraction, or distortion) of materials generated during a process. A description that a direction in which the channel structure CH and/or the dummy channel structure DCH extend is substantially parallel with the vertical direction (Z direction) may mean that an angle between the directions in which the channel structure CH and/or the dummy channel structure DCH extend and the vertical direction (Z direction) is about 0° to about 10°, for example, about 0° to about 5°, or about 0° to about 2°.

The plurality of channel structures CH may be two-dimensionally arranged in the cell region CELL of the stacked structure SS, and the plurality of dummy channel structures DCH may be two-dimensionally arranged in the connection region EXT of the stacked structure SS. The plurality of channel structures CH arranged in the first horizontal direction (X direction) may be referred to as a row of the channel structures CH. For example, the memory device 100 may include first through third rows CH1 through CH3 of the channel structures. The first through third rows CH1 through CH3 of the channel structures may be spaced apart from each other in the second horizontal direction (Y direction).

Each channel structure CH and each dummy channel structure DCH may include a channel pattern 162, a buried insulating pattern 161, a pad pattern 164, and a gate insulating pattern 163. The channel pattern 162 may penetrate the plurality of gate layers (150a through 150c) and the plurality of interlayer insulating layers 140. The channel pattern 162 may include a semiconductor material. In an example embodiment, the channel pattern 162 may have a cup shape (or a cylinder shape with a closed bottom and a hollow space). Thus, the channel pattern 162 may extend along a side surface and a bottom surface of the channel structure CH. The hollow space defined by the channel pattern 162 may be filled by the buried insulating pattern 161. The buried insulating pattern 161 may include an insulation material. Different from what is illustrated in FIGS. 4B and 4C, in some embodiments, channel pattern 162 may have a cylindrical or circular pillar shape, and the buried insulating pattern 161 may be omitted. The pad pattern 164 may be on a top surface of the channel structure CH. The pad pattern 164 may include a semiconductor material.

The gate insulating pattern 163 may be between the channel pattern 162 and the stacked structure SS. The gate insulating pattern 163 may extend along the side and bottom surfaces of the channel structure CH. In an example embodiment, different from what is illustrated in FIGS. 4B, 4C, and 8B, at least a portion of the gate insulating pattern 163 may not be included in the channel structure CH or the dummy channel structure DCH, and may also be between the interlayer insulating layer 140 and the plurality of gate layers (150a through 150c). The gate insulating pattern 163 may include a blocking insulating layer, a tunnel insulating layer, and a charge storage layer between the blocking insulating layer and the tunnel insulating layer. The blocking insulating layer may include an insulating material such as silicon oxide, hafnium oxide, lanthanum oxide, zircon oxide, tantalum oxide, or a combination thereof. The charge storage layer may include an insulating material such as silicon oxide, silicon nitride, or a combination thereof. The charge storage layer may be a trap type. For example, the charge storage layer may further include quantum dots or nanocrystals. Herein, the quantum dot or the nanocrystal may include fine particles of a conductive material. The tunnel insulating layer may include an insulation material such as silicon oxide, hafnium oxide, lanthanum oxide, zircon oxide, tantalum oxide, or a combination thereof. In an example embodiment, the blocking insulating layer and the tunnel insulating layer may include an oxide, and the charge storage layer may include a nitride.

The stacked structure SS may include a plurality of cutouts, for example, cutouts HWC, FW, HS, FS, HGC, HWE, DWE, and HGE. The cutouts (HWC, FW, HS, FS, HGC, HWE, DWE, and HGE) of the stacked structure SS may be openings or recesses formed in the stacked structure SS.

The stacked structure SS may include a cell region discontinuous cutout HWC. For example, the stacked structure SS may include a first row HWC1 and a second row HWC2 of cell region discontinuous cutouts HWC. Each of the first row HWC1 and the second row HWC2 may include a plurality of cell region discontinuous cutouts HWC.

The cell region discontinuous cutout HWC may also be referred to as a discontinuous cutout, a cell region cutout, or a cutout.

Each of rows (HWC1 and HWC2) of the cell region discontinuous cutout HWC may be spaced apart from each other, and may be arranged to extend in the cell region CELL of the stacked structure SS in the first horizontal direction (X direction). The cell region discontinuous cutout HWC of the stacked structure SS may extend in the first horizontal direction (X direction), and may cut the plurality of gate layers (150a through 150c) of the stacked structure SS. Thus, each of rows (HWC1 and HWC2) of the cell region discontinuous cutout HWC may discontinuously cut the plurality of gate layers (150a through 150c) in the cell region CELL of the stacked structure SS in the first horizontal direction (X direction).

In an example embodiment, as illustrated in FIG. 4D, a bottom surface of at least one of the cell region discontinuous cutouts HWC may be upwardly convex, such that a depth D1 (in the vertical direction (Z direction)) of an end of the at least one cell region discontinuous cutout HWC is greater than a depth D2 (in the vertical direction (Z direction)) of a center of the at least one cell region discontinuous cutout HWC. In another example embodiment, different from what is illustrated in FIG. 4D, the bottom surface of the at least one cell region discontinuous cutout HWC may be downwardly convex or flat.

Figure 5:
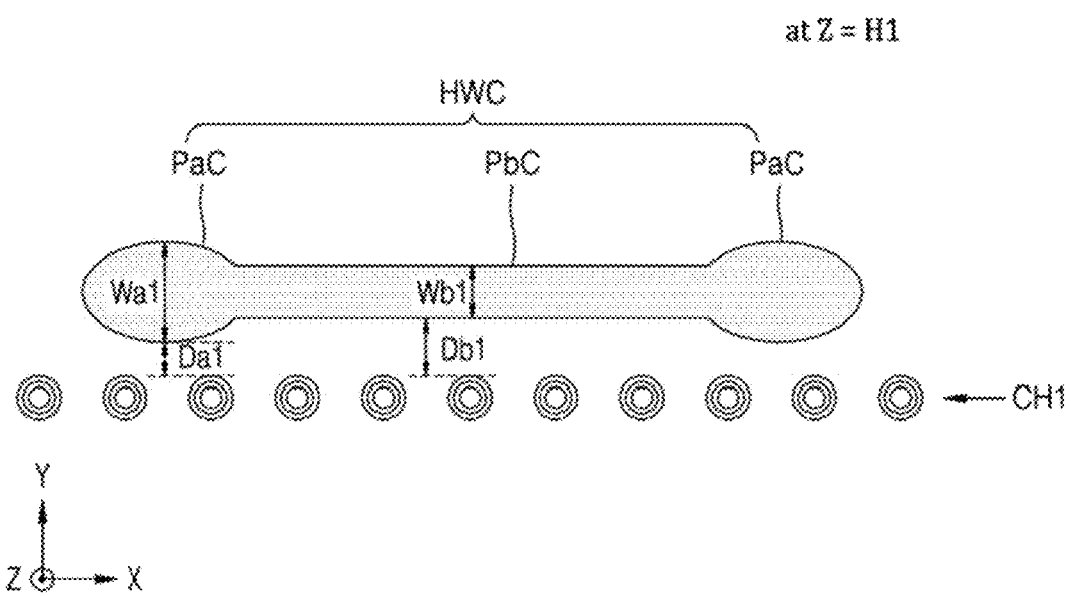
FIG. 5 is a cross-sectional view schematically illustrating a cell region discontinuous cutout and a row of channel structures at a first height illustrated in FIG. 4B, according to an example embodiment.

In an example embodiment, as illustrated in FIG. 5, the cell region discontinuous cutout HWC may have an end portion PaC and a center cutout PbC. As illustrated in FIG. 5, as a maximum width Wa1 of the end portion PaC of the cell region discontinuous cutout HWC in the second horizontal direction (Y direction) at a first height H1 becomes greater than a maximum width Wb1 of a center cutout PbC of the cell region discontinuous cutout HWC in the second horizontal direction (Y direction) at a first height H1, the bottom surface of the at least one cell region discontinuous cutout HWC may tend to be upwardly convex.

For example, as illustrated in FIG. 5, at a first height H1 in the Z direction (see FIG. 4B), a maximum width Wa1 (in the second horizontal direction (Y direction)) of the end portion PaC may be greater than a maximum width Wb1 (in the second horizontal direction (Y direction)) of the center cutout PbC.

Referring again to FIG. 4A, the first row HWC1 and the second row HWC2 of the cell region discontinuous cutouts HWC may be spaced apart from each other in the second horizontal direction (Y direction). The first row HWC1 of the cell region discontinuous cutouts HWC may be between the first row CH1 and the second row CH2 of the channel structures CH. The second row HWC2 of the cell region discontinuous cutouts HWC may be between the second row CH2 and the third row CH3 of the channel structures CH.

Two neighboring cell region discontinuous cutouts HWC in the first row HWC1 may have a gap G1 therebetween. Two neighboring cell region discontinuous cutouts HWC in the second row HWC2 may have a gap G2 therebetween. In an example embodiment, the gap G1 in the first row HWC1 may not be aligned along a same line in the second horizontal direction (Y direction) with the gap G2 in the second row HWC2. That is, the gaps G1 and G2 may be offset in the X direction. This arrangement may facilitate operations of removing a plurality of sacrificial layers (180a through 180c) and then filling the plurality of gate layers (150a through 150c), as described in FIGS. 14I through 14K. In addition, this arrangement may alleviate tilting of the stacked structure SS due to internal stress and strain (for example, deformation, expansion, and contraction) of materials that may occur during manufacturing operations.

In an example embodiment, the cell region discontinuous cutout HWC may be filled with an insulating material IM. In an example embodiment, as illustrated in FIG. 4C, the at least one cell region discontinuous cutout HWC may include a void VD in the insulating material IM. Further, in a similar structure to that described in detail above with reference to FIG. 5, as the maximum width of the end portion PaC of the cell region discontinuous cutout HWC in the second direction (Y direction) at the first height H1 becomes greater than the maximum width Wb1 of the center cutout PbC of the cell region discontinuous cutout HWC in the second horizontal direction (Y direction) at the first height H1, the void VD may tend to be formed at the end portion PaC of the cell region discontinuous cutout HWC.

In another example embodiment, the cell region discontinuous cutout HWC may be filled by a common source line (not illustrated) extending in the vertical direction (Z direction) in the cell region discontinuous cutout HWC, and an insulating spacer (not illustrated) that is on the side surfaces of the cell region discontinuous cutout HWC and surrounds the common source line.

According to an example embodiment, an uncut portion in the cell region CELL of the stacked structure SS between two neighboring cell region discontinuous cutouts HWC in each of the rows (HWC1 and HWC2) of the cell region discontinuous cutouts HWC may alleviate the tilting of the stacked structure SS due to the internal stresses and deformations (for example, expansion, contraction, or distortion) of materials that may occur during the manufacturing process. Accordingly, even when the memory device 100 including a stacked structure SS is manufactured to have a larger number of gate layers (150a through 150c) and the interlayer insulating layers 140, difficulties in processes that may be generated due to the tilting of the stacked structure may be alleviated. Accordingly, the memory device 100 may be provided with a higher degree of integration.

In an example embodiment, a continuous cutout FW may extend over the cell region CELL and the connection region EXT of the stacked structure SS in the first horizontal direction (X direction), and may cut the plurality of gate layers (150a through 150b) of the stacked structure SS. Thus, the continuous cutout FW may continuously cut the plurality of gate layers (150a through 150b) in the cell region CELL and the connection region EXT of the stacked structure SS in the first horizontal direction (X direction). The continuous cutout FW may be filled with an insulating material.

The second row CH2 and a third row CH3 of the channel structures CH may be between the continuous cutout FW and the first row HWC1 of the cell region discontinuous cutouts HWC. The third row CH3 of the channel structures CH may be between the continuous cutout FW and the second row HWC2 of the cell region discontinuous cutouts HWC. The second row CH2 of the channel structures CH may be between the first row HWC1 and the second row HWC2 of the cell region discontinuous cutouts HWC.

In an example embodiment, as illustrated in FIG. 4B, due to the internal stress and strain (for example, deformation, expansion, or contraction) that may occur in the manufacturing process, the maximum width Wb1 (in the second horizontal direction (Y direction)) of the center portion of the cell region discontinuous cutout HWC at the first height H1 may be less than a maximum width W5 (in the second horizontal direction (Y direction)) of the continuous cutout FW at the first height H1. The maximum width Wb1 (in the second horizontal direction (Y direction)) of the center portion of the cell region discontinuous cutout HWC may decrease as the height increases, while the maximum width W5 (in the second horizontal direction (Y direction)) of the continuous cutout FW may increase as the height increases.

The discontinuous top cutout HS may also be referred to as a top cutout. The discontinuous top cutout HS may be filled with an insulating material.

The discontinuous top cutout HS may be arranged in a first row HS1 and a second row HS2. The first row HS1 and the second row HS2 of the discontinuous top cutouts HS may be spaced apart from each other in the second horizontal direction (Y direction). The rows (HS1 and HS2) of the discontinuous top cutout HS may be arranged to extend in the cell region CELL of the stacked structure SS in the first horizontal direction (X direction). The discontinuous top cutout HS may extend in the first horizontal direction (X direction) to cut at least one top gate layer 150c, but may not cut the plurality of intermediate gate layers 150b and at least one bottom gate layer 150a. Thus, each of rows (HS1 and HS2) of the discontinuous top cutout HS may discontinuously cut only the top gate layer(s) 150c in the cell region CELL of the stacked structure SS in the first horizontal direction (X direction).

The discontinuous top cutout HS in the first row HS1 of the discontinuous top cutouts HS may be between two neighboring cell region discontinuous cutouts HWC in the first row HWC1 of the cell region discontinuous cutouts HWC. The discontinuous top cutout HS in the second row HS2 of the discontinuous top cutouts HS may extend between two neighboring cell region discontinuous cutouts HWC in the second row HWC2 of the cell region discontinuous cutouts HWC.

In an example embodiment, the discontinuous top cutout HS in the first row HS1 of the discontinuous top cutouts HS may not be aligned along a same line in the second horizontal direction (Y direction) with the discontinuous top cutout HS in the second row HS2 of the discontinuous top cutouts HS.

Each of the continuous top cutouts (FS1 through FS3) may extend in the first horizontal direction (X direction) to cut the at least one top gate layer 150c, but may not cut the plurality of intermediate gate layers 150b and at least one bottom gate layer 150a. Thus, each of the continuous top cutouts (FS1 through FS3) may continuously cut only the top gate layer(s) 150c in the cell region CELL of the stacked structure SS in the first horizontal direction (X direction).

The continuous top cutouts (FS1 through FS3) may be spaced apart from each other in the second horizontal direction (Y direction). The second continuous top cutout FS2 may be between the first row HWC1 and the second row HWC2 of the cell region discontinuous cutouts HWC, and the third continuous top cutout FS3 may be between the second row HWC2 of the cell region discontinuous cutouts HWC and the continuous cutout FW. The first row HWC1 of the cell region discontinuous cutouts HWC may be between the first continuous top cutout FS1 and the second continuous top cutout FS2, and the second row HWC2 of the cell region discontinuous cutouts HWC may be between the second continuous top cutout FS2 and the third continuous top cutout FS3. The continuous top cutouts (FS1 through FS3) may be filled with an insulating material.

A cell region discontinuous bottom cutout HGC may also be referred to as a cell region bottom cutout or a bottom cutout. Each of rows (HGC1 and HGC2) of the cell region discontinuous bottom cutouts HGC may be spaced apart from each other, and may be arranged in the cell region CELL of the stacked structure SS to extend in the first horizontal direction (X direction). The cell region discontinuous bottom cutout HGC may extend in the first horizontal direction (X direction) to cut at least one bottom gate layer 150a, but may not cut the plurality of intermediate gate layers 150b and at least one top gate layer 150c. Thus, each of rows (HGC1 and HGC2) of the cell region discontinuous bottom cutout HGC may discontinuously cut only the bottom gate layer(s) 150a in the cell region CELL of the stacked structure SS in the first horizontal direction (X direction).

The cell region discontinuous bottom cutout HGC in the first row HGC1 of the cell region discontinuous bottom cutouts HGC may be between two neighboring cell region discontinuous cutouts HWC in the first row HWC1 of the cell region discontinuous cutouts HWC, and the cell region discontinuous bottom cutout HGC in the second row HGC2 of the cell region discontinuous bottom cutouts HGC may extend between two neighboring cell region discontinuous cutouts HWC in the second row HWC2 of the cell region discontinuous cutouts HWC.

The first row HGC1 and the second row HGC2 of the cell region discontinuous bottom cutouts HGC may be spaced apart from each other in the second horizontal direction (Y direction). In an example embodiment, the cell region discontinuous bottom cutout HGC in the first row HGC1 of the cell region discontinuous bottom cutouts HGC may not be aligned along a same line in the second horizontal direction (Y direction) with the cell region discontinuous bottom cutout HGC in the second row HGC2 of the cell region discontinuous bottom cutouts HGC. The cell region discontinuous bottom cutout HGC may be filled with an insulating material. In an example embodiment, the cell region discontinuous bottom cutouts HGC may overlap the discontinuous top cutouts HS in the vertical direction (Z direction).

The connection region discontinuous cutout HWE may also be referred to as a connection region cutout.

As shown in, for example, FIG. 8A, each of rows (HWE1 and HWE2) of the connection region discontinuous cutout HWE may be spaced apart from each other, and may be arranged in the connection region EXT of the stacked structure SS to extend in the first horizontal direction (X direction). The connection region discontinuous cutout HWE may extend in the first horizontal direction (X direction) to cut the plurality of gate layers (150a through 150c) of the stacked structure SS. Thus, each of rows (HWE1 and HWE2) of the connection region discontinuous cutout HWE may discontinuously cut the plurality of gate layers (150a through 150c) in the connection region EXT of the stacked structure SS in the first horizontal direction (X direction).

In an example embodiment, a gap G3 between two neighboring connection region discontinuous cutouts HWE in the first row HWE1 of the connection region discontinuous cutouts HWE may be aligned along a same line in the second horizontal direction (Y direction) with a gap G4 between two neighboring connection region discontinuous cutouts HWE in the second row HWE2 of the connection region discontinuous cutouts HWE. However, in other embodiments, different from what is illustrated in FIG. 8A, the gap G3 between two neighboring connection region discontinuous cutouts HWE in the first row HWE1 of the connection region discontinuous cutouts HWE may not be aligned with the gap G4 between the two neighboring connection region discontinuous cutouts HWE in the second row HWE2 of the connection region discontinuous cutouts HWE in the second horizontal direction (Y direction).

The first row HWE1 and the second row HWE2 of the connection region discontinuous cutouts HWE may be spaced apart from each other in the second horizontal direction (Y direction). In an example embodiment, the first row HWE1 of the connection region discontinuous cutouts HWE may be aligned with the first row HWC1 of the cell region discontinuous cutouts HWC in the first horizontal direction (X direction), and the second row HWE2 of the connection region discontinuous cutouts HWE may be aligned with the first row HWC1 of the cell region discontinuous cutouts HWE in the first horizontal direction (X direction).

In an example embodiment, the connection region discontinuous cutout HWE may be filled with an insulating material. In an example embodiment, the at least one connection region discontinuous cutouts HWE may include a void (not illustrated) in the insulating material.

Figure 9:
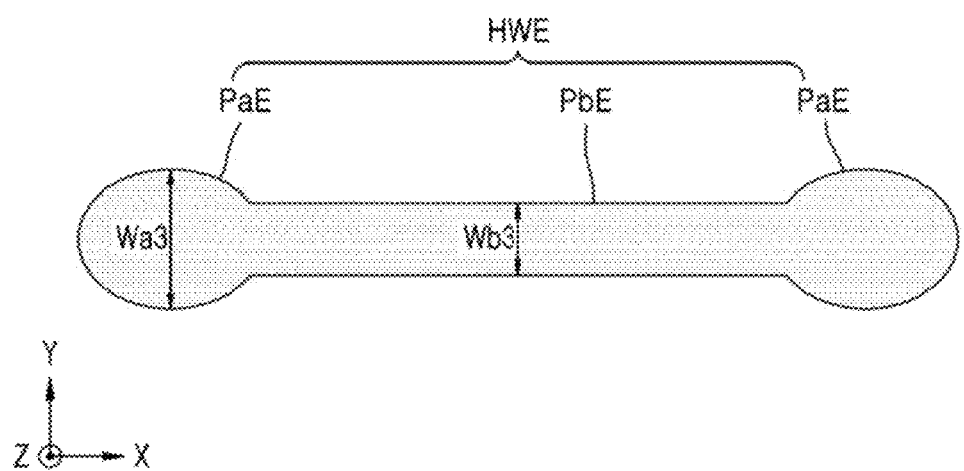
FIG. 9 is a cross-sectional view schematically illustrating a connection region discontinuous cutout at a first height illustrated in FIG. 8B, according to an example embodiment.

In an example embodiment, as illustrated in FIG. 9, as a maximum width Wa3 (in the second horizontal direction (Y direction)) of the end portion PaE of the connection region discontinuous cutout HWE at the first height H1 becomes greater than a maximum width Wb4 (in the second horizontal direction (Y direction)) of a center portion PbE of the connection region discontinuous cutout HWE at the first height H1, the void (not illustrated) may tend to be formed at the end portion of the connection region discontinuous cutout HWE.

In another example embodiment, the cell region discontinuous cutout HWE may be filled by a common source line (not illustrated) extending in the vertical direction (Z direction) in the connection region discontinuous cutout HWE, and an insulating spacer (not illustrated) that is on the side surfaces of the connection region discontinuous cutout HWE and surrounds the common source line (not illustrated).

Referring again to FIG. 8A, an uncut portion in the connection region EXT of the stacked structure SS between two neighboring connection region discontinuous cutouts HWE in each of the rows (HWE1 and HWE2) of the connection region discontinuous cutouts HWE may alleviate the tilting of the stacked structure SS due to the internal stress and strain (for example, expansion, contraction, or distortion) of materials that may occur during the manufacturing process. Accordingly, even when the memory device 100 including a stacked structure SS is manufactured with a larger number of gate layers (150a through 150c) and the interlayer insulating layers 140 stacked, difficulties in processes that may be generated due to the tilting of the stacked structure SS may be alleviated. Accordingly, the memory device 100 may be provided with a higher degree of integration.

Each of rows (DWE1 and DWE2) of the dummy discontinuous cutout DWE may be spaced apart from each other, and arranged in the connection region EXT of the stacked structure SS to extend in the first horizontal direction (X direction). The dummy discontinuous cutout DWE may extend in the first horizontal direction (X direction) to cut the plurality of gate layers (150a through 150c) of the stacked structure SS. Thus, each of rows (DWE1 and DWE2) of the dummy discontinuous cutout DWE may discontinuously cut the plurality of gate layers (150a through 150c) in the connection region EXT of the stacked structure SS in the first horizontal direction (X direction).

The second row DWE2 of the dummy discontinuous cutouts DWE may be positioned between the first row HWE1 and the second row HWE2 of the connection region discontinuous cutouts HWE, and the third row DWE3 of the dummy discontinuous cutouts DWE may be between the second row of HWE2 of the connection region discontinuous cutouts HWE and the continuous cutout FW. The first row HWE1 of the connection region discontinuous cutouts HWE may be between the first row DWE1 and the second row DWE2 of the dummy discontinuous cutouts DWE, and the second row HWE2 of the connection region discontinuous cutouts HWE may be between the second row DWE2 and the third row DWE3 of the dummy discontinuous cutouts DWE.

The first row DWE1 and the second row DWE2 of the dummy discontinuous cutouts DWE may be spaced apart from each other in the second horizontal direction (Y direction). In an example embodiment, the first row DWE1 of the dummy discontinuous cutouts DWE may be aligned with a first continuous top cutout FS1 in the first horizontal direction X, and the second row DWE2 of the dummy discontinuous cutouts DWE may be aligned with a second continuous top cutout FS2 in the first horizontal direction X, and the third row DWE3 of the dummy discontinuous cutouts DWE may be aligned with a third continuous top cutout FS3 in the first horizontal direction X.

In an example embodiment, the dummy discontinuous cutout DWE may be filled with an insulating material. In an example embodiment, the at least one dummy discontinuous cutout DWE may include a void (not illustrated) in the insulating material. In particular, as a maximum width in the second horizontal direction (Y direction) of an end portion of the dummy discontinuous cutout DWE becomes greater than a maximum width in the second horizontal direction (Y direction) of the center portion of the dummy discontinuous cutout DWE, a void (not illustrated) may tend to be formed at the end portion of the dummy discontinuous cutout HWE.

The connection region discontinuous bottom cutout HGE may also be referred to as a connection region bottom cutout. In an example embodiment, the connection region discontinuous bottom cutout HGE may be filled with an insulating material.

Each of rows (HGE1 and HGE2) of the connection region discontinuous bottom cutouts HGE may be spaced apart from each other, and arranged in the cell region CELL of the stacked structure SS to extend in the first horizontal direction (X direction). The connection region discontinuous bottom cutout HGE may extend in the first horizontal direction (X direction) to cut the at least one bottom gate layer 150a, but may not cut the plurality of intermediate gate layers 150b and at least one top gate layer 150c. Thus, each of rows (HGE1 and HGE2) of the connection region discontinuous bottom cutout HGE may discontinuously cut only the bottom gate layer(s) 150a in the connection region EXT of the stacked structure SS in the first horizontal direction (X direction).

The connection region discontinuous bottom cutout HGE in the first row HGC1 of the connection region discontinuous bottom cutouts HGE may be between two neighboring connection region discontinuous cutouts HWE in the first row HWE1 of the connection region discontinuous cutouts HWE, and the connection region discontinuous bottom cutout HGE in the second row HGE2 of the connection region discontinuous bottom cutouts HGE may extend between two neighboring connection region discontinuous cutouts HWE in the second row HWE2 of the connection region discontinuous cutouts HWE.

The first row HGE1 and the second row HGE2 of the connection region discontinuous bottom cutouts HGE may be spaced apart from each other in the second horizontal direction (Y direction). In an example embodiment, the cell region discontinuous bottom cutout HGC in the first row HGC1 of the cell region discontinuous bottom cutouts HGC may be aligned with the cell region discontinuous bottom cutout HGC in the second row HGC2 of the cell region discontinuous bottom cutouts HGC in the second horizontal direction (Y direction).

In another example embodiment, different from what is illustrated in FIG. 8A, the cell region discontinuous lower cutout HGC in the first row HGC1 of the cell region discontinuous lower cutouts HGC may not be aligned with the cell region discontinuous bottom cutout HGC in the second row HGC2 of the cell region discontinuous lower cutouts HGC in the second horizontal direction (Y direction).

As shown in, for example, FIG. 4B, in an example embodiment, the memory device 100 may further include a first semiconductor layer 132, an etch stop layer 133, and a plurality of support patterns SP between the substrate 110 and the stacked structure SS. The gate insulating pattern 163 of each of the channel structure CH and the dummy channel structure DCH may expose a bottom portion of the channel pattern 162, and the first semiconductor layer 132 may be in contact with an exposed portion of the channel pattern 162 of each of the channel structure CH and the dummy channel structure DCH. The etch stop layer 133 may be between the first semiconductor layer 132 and the stacked structure SS. The etch stop layer 133 may include a semiconductor material. The etch stop layer 133 may prevent etching of a first interlayer insulating layer 140a when a first gap 181G is formed between the substrate 110 and the first interlayer insulating layer 140a by removing a sacrificial layer 181 illustrated in FIGS. 14G and 14H The plurality of support patterns SP may be surrounded by the first semiconductor layer 132 in a plan view. The support pattern SP may include a semiconductor material. The plurality of support patterns SP may be two-dimensionally arranged on the substrate 110. In an example embodiment, the etch stop layer 133 and the plurality of support patterns SP may be integrally formed. Thus, the etch stop layer 133 and the plurality of support patterns SP may be simultaneously formed with the same material.

As shown in, for example, FIG. 4B, in an example embodiment, the support pattern SP may overlap the cell region discontinuous cutout HWC in the vertical direction (Z direction). In this manner, the cell region discontinuous cutout HWC may be prevented from being formed to penetrate the sacrificial layer 181 (see, for example, the operation illustrated in FIG. 14G), while enabling removal of the sacrificial layer 181 (see, for example, the operations illustrated in FIGS. 14G and 14H).

In an example embodiment, the support pattern SP may be between two neighboring cell region discontinuous cutouts HWC in each of rows (HWC1 and HWC2) of the cell region discontinuous cutouts HWC, and at least one of the plurality of support patterns SP may overlap the two neighboring cell region discontinuous cutouts HWC in each of rows (HWC1 and HWC2) of the cell region discontinuous cutouts HWC in the vertical direction (Z direction). Thus, when the bottom surface of the at least one cell region discontinuous cutout HWC is formed upwardly convex, the cell region discontinuous cutout HWC may be prevented from being formed to penetrate the sacrificial layer 181 (see, for example, the operation illustrated in FIG. 14G), while enabling removal of the sacrificial layer 181 (see, for example, the operations illustrated in FIGS. 14G and 14H).

The memory device 100 may further include an interlayer insulating layer 140 on the stacked structure SS. The memory device 100 may further include a plurality of contact plugs CP on the connection region EXT of the stacked structure SS extending in the vertical direction (Z direction). The plurality of contact plugs CP may be electrically connected to the plurality of gate layers (150a through 150c), respectively. The contact plug CP may include a conductive material.

FIG. 5 is a schematic cross-sectional view of the cell region discontinuous cutout HWC and the row CH1 of the channel structures CH at the first height H1 illustrated in FIG. 4B, according to an example embodiment.

Referring to FIG. 5, the cell region discontinuous cutout HWC may include the end portion PaC and the center portion PbC that are arranged in the first horizontal direction (X direction). The cell region discontinuous cutout HWC may include two end portions PaC spaced apart from each other in the first horizontal direction (X direction), and the center portion PbC between the two end portions PaC.

In an example embodiment, the cell region discontinuous cutout HWC may have a dumbbell-shaped cross section at the first height H1. Thus, while a width of the center portion PbC of the cell region discontinuous cutout HWC in the second horizontal direction (Y direction) at the first height H1 may be substantially constant regardless of a location in the X-direction, the width of the end portion PaC of the cell region discontinuous cutout HWC in the second horizontal direction (Y direction) at the first height H1 may increase and then decrease as the location in the X-direction moves away from the center portion PbC. The maximum width Wa1 of the end portion PaC of the cell region discontinuous cutout HWC at the first height H1 in the second horizontal direction (Y direction) may be greater than the maximum width Wb1 of the center portion PbC the cell region discontinuous cutout HWC in the second horizontal direction (Y direction) at the first height H1. Thus, a distance Da1 from the end portion PaC of the cell region discontinuous cutout HWC to the row CH1 of the channel structures CH in the second horizontal direction (Y direction) at the first height H1 may be less than a distance Db1 from the center portion PbC of the cell region discontinuous cutout HWC to the row CH1 of the channel structures CH in the second horizontal direction (Y direction). By forming the maximum width Wa1 of the end portion PaC of the cell region discontinuous cutout HWC in the second horizontal direction (Y direction) greater than the maximum width Wb1 of the center portion PbC of the cell region discontinuous cutout HWC at the first height H1, the operation of forming the cell region discontinuous cutout HWC and the operation of forming the gate layers (150a through 150c) may be easily performed.

Figure 6:
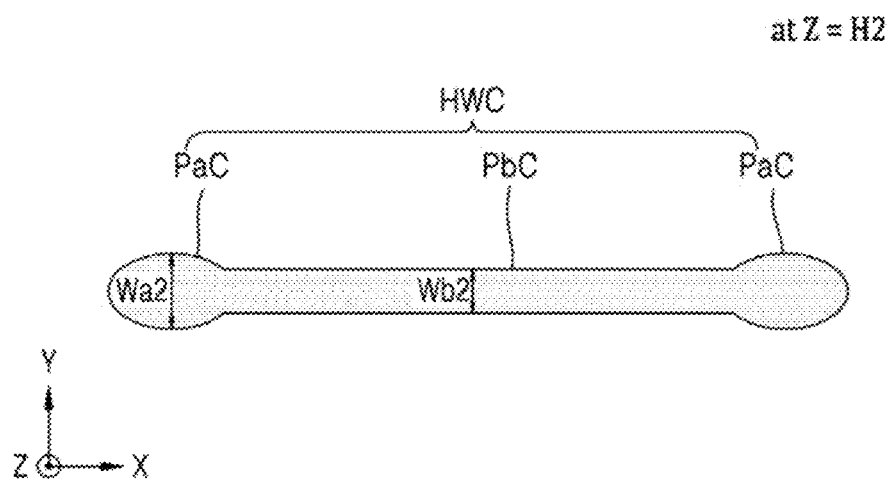
FIG. 6 is a cross-sectional view schematically illustrating a cell region discontinuous cutout at a second height less than the first height illustrated in FIG. 4B, according to an example embodiment.

FIG. 6 is a schematic cross-sectional view of the cell region discontinuous cutout HWC according to an example embodiment at a second height H2 lower (for example, closer to the substrate 110) than the first height H1 illustrated in FIG. 4B.

Referring to FIG. 6, the cell region discontinuous cutout HWC may have a dumbbell-shaped cross section at the second height H2. Thus, while a width of the center portion PbC of the cell region discontinuous cutout HWC in the second horizontal direction (Y direction) at the second height H2 may be substantially constant regardless of a location in the X-direction, the width of the end portion PaC of the cell region discontinuous cutout HWC in the second horizontal direction (Y direction) at the second height H2 may increase and then decrease as the location in the X-direction moves away from the center portion PbC. A maximum width Wa2 of the end portion PaC of the cell region discontinuous cutout HWC in the second horizontal direction (Y direction) at the second height H2 may be greater than a maximum width Wb2 of the center portion PbC the cell region discontinuous cutout HWC in the second horizontal direction (Y direction) at the second height H2.

Comparing FIGS. 5 and 6, the maximum width Wa2 of the end portion PaC of the cell region discontinuous cutout HWC in the second horizontal direction (Y direction) at the second height H2 may be less than the maximum width Wa1 of the end portion PaC of the cell region discontinuous cutout HWC in the second horizontal direction (Y direction) at the first height H1. The maximum width Wb2 of the center portion PbC of the cell region discontinuous cutout HWC in the second horizontal direction (Y direction) at the second height H2 may be equal to or less than the maximum width Wb1 of the center portion PbC of the cell region discontinuous cutout HWC in the second horizontal direction (Y direction) at the first height H1.

Figure 7:
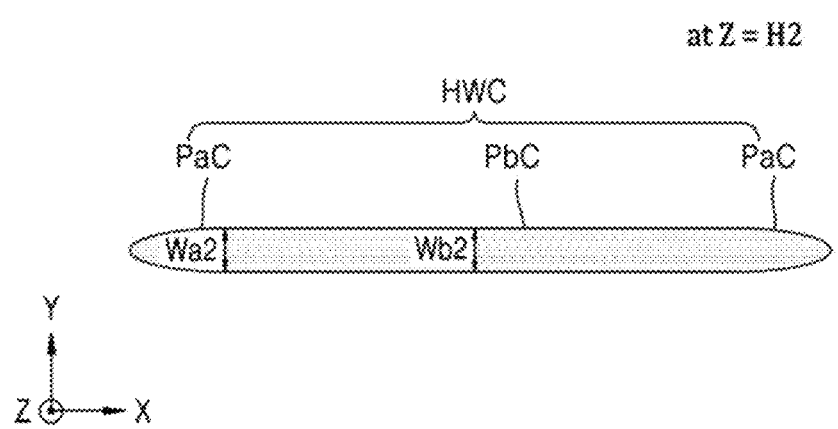
FIG. 7 is a cross-sectional view schematically illustrating a cell region discontinuous cutout at a second height less than the first height illustrated in FIG. 4B, according to an example embodiment.

FIG. 7 is a schematic cross-sectional view of the cell region discontinuous cutout HWC according to an example embodiment at the second height H2 less than the first height H1 illustrated in FIG. 4B.

Referring to FIG. 7, in an example embodiment, while a width of the center portion PbC of the cell region discontinuous cutout HWC in the second horizontal direction (Y direction) at the second height H2 may be substantially constant regardless of a location in the X-direction, the width of the end portion PaC of the cell region discontinuous cutout HWC in the second horizontal direction (Y direction) at the second height H2 may decrease as the location in the X-direction moves away from the center portion PbC. The maximum width Wa2 of the end portion PaC of the cell region discontinuous cutout HWC in the second horizontal direction (Y direction) at the second height H2 may be equal to or less than the maximum width Wb2 of the center portion PbC the cell region discontinuous cutout HWC in the second horizontal direction (Y direction) at the second height H2.

FIG. 9 is a schematic cross-sectional view of the connection region discontinuous cutout HWE according to an example embodiment at the first height H1 illustrated in FIG. 8B.

Referring to FIG. 9, the connection region discontinuous cutout HWE may include the end portion PaE and the center portion PbE that are arranged in the first horizontal direction (X direction). The connection region discontinuous cutout HWE may include two end portions PaE spaced apart from each other in the first horizontal direction (X direction), and the center portion PbE between the two end portions PaE.

In an example embodiment, the connection region discontinuous cutout HWE may have a dumbbell-shaped cross section at the first height H1. Thus, while a width of the center portion PbE of the connection region discontinuous cutout HWE in the second horizontal direction (Y direction) at the first height H1 may be substantially constant regardless of a location in the X-direction, the width of the end portion PaE of the connection region discontinuous cutout HWE in the second horizontal direction (Y direction) at the first height H1 may increase and then decrease as the location in the X-direction moves away from the center portion PbE. The maximum width Wa3 of the end portion PaE of the connection region discontinuous cutout HWE in the second horizontal direction (Y direction) at the first height H1 may be greater than the maximum width Wb3 of the center portion PbE the connection region discontinuous cutout HWE in the second horizontal direction (Y direction) at the first height H1.

Comparing FIGS. 5 and 9, in some embodiments, the maximum width Wa1 of the end portion PaC of the cell region discontinuous cutout HWC in the second horizontal direction (Y direction) at the first height H1 may be less than the maximum width Wa3 of the end portion PaE of the connection region discontinuous cutout HWE in the second horizontal direction (Y direction) at the first height H1.

Figure 10:
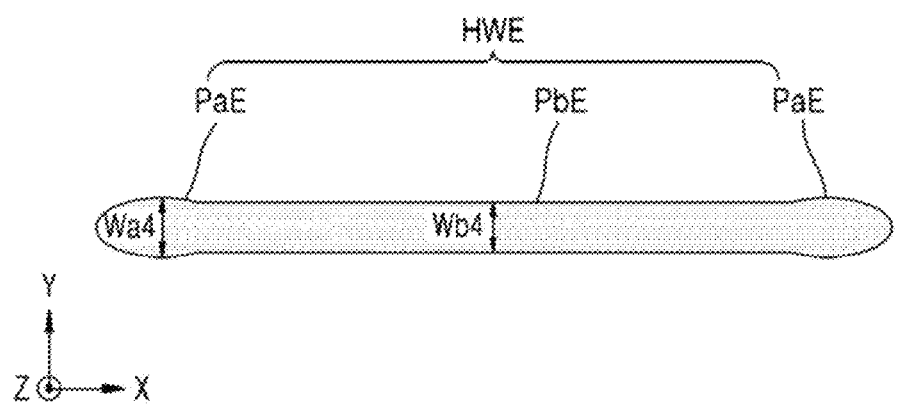
FIG. 10 is a cross-sectional view schematically illustrating a connection region discontinuous cutout at a second height less than the first height illustrated in FIG. 8B, according to an example embodiment.

FIG. 10 is a schematic cross-sectional view of the connection region discontinuous cutout HWE according to an example embodiment at the second height H2 lower (for example, closer to the substrate 110) than the first height H1 illustrated in FIG. 8B.

Referring to FIG. 10, in an example embodiment, the connection region discontinuous cutout HWE may have a dumbbell-shaped cross section at the second height H2. Thus, while a width of the center portion PbE of the connection region discontinuous cutout HWE in the second horizontal direction (Y direction) at the second height H2 may be substantially constant regardless of a location in the X-direction, the width of the end portion PaE of the connection region discontinuous cutout HWE in the second horizontal direction (Y direction) at the second height H2 may increase and then decrease as the location in the X-direction moves away from the center portion PbE. In an example embodiment, a maximum width Wa4 of the end portion PaE of the connection region discontinuous cutout HWE in the second horizontal direction (Y direction) at the second height H2 may be greater than a maximum width Wb4 of the center portion PbE of the connection region discontinuous cutout HWE in the second horizontal direction (Y direction) at the second height H2.

Comparing FIGS. 9 and 10, the maximum width Wa4 of the end portion PaE of the connection region discontinuous cutout HWE in the second horizontal direction (Y direction) at the second height H2 may be less than the maximum width Wa3 of the end portion PaE of the connection region discontinuous cutout HWE in the second horizontal direction (Y direction) at the first height H1. The maximum width Wb4 of the center portion PbE of the connection region discontinuous cutout HWE in the second horizontal direction (Y direction) at the second height H2 may be equal to or less than the maximum width Wb3 of the center portion PbE of the connection region discontinuous cutout HWE in the second horizontal direction (Y direction) at the first height H1.

Comparing FIGS. 6 and 10, in some embodiments, the maximum width Wa2 of the end portion PaC of the cell region discontinuous cutout HWC in the second horizontal direction (Y direction) at the second height H2 may be greater than the maximum width Wa4 of the end portion PaE of the connection region discontinuous cutout HWE in the second horizontal direction (Y direction) at the second height H2.

Figure 11:
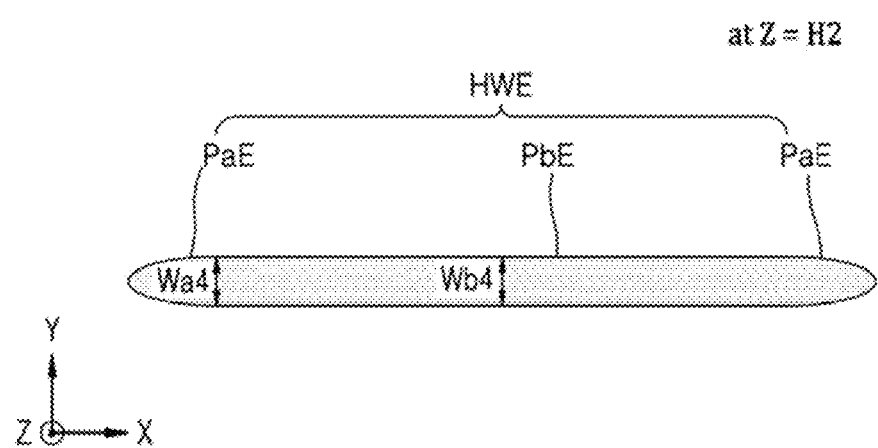
FIG. 11 is a cross-sectional view schematically illustrating a connection region discontinuous cutout at the second height less than the first height illustrated in FIG. 8B, according to an example embodiment.

FIG. 11 is a schematic cross-sectional view of the connection region discontinuous cutout HWE according to an example embodiment at the second height H2 lower (for example, closer to the substrate 110) than the first height H1 illustrated in FIG. 8B.

Referring to FIG. 11, in an example embodiment, while a width of the center portion PbE of the connection region discontinuous cutout HWE in the second horizontal direction (Y direction) at the second height H2 may be substantially constant regardless of a location in the X-direction, the width of the end portion PaE of the connection region discontinuous cutout HWE in the second horizontal direction (Y direction) at the second height H2 may decrease as the location in the X-direction moves away from the center portion PbE. The maximum width Wa4 of the end portion PaE of the connection region discontinuous cutout HWE in the second horizontal direction (Y direction) at the second height H2 may be equal to or less than the maximum width Wb4 of the center portion PbE of the connection region discontinuous cutout HWE in the second horizontal direction (Y direction) at the second height H2.

Figure 12:
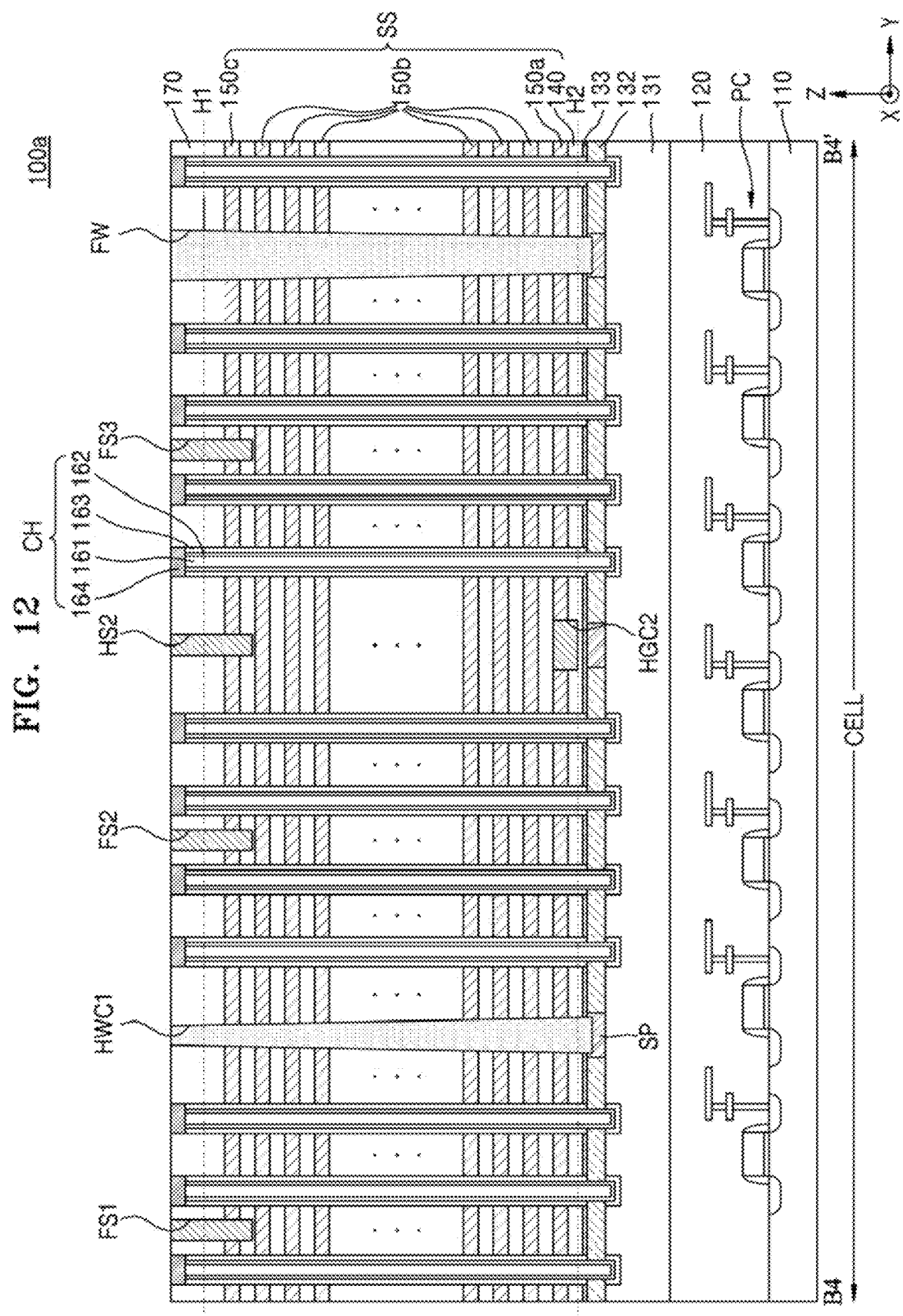
FIG. 12 is a cross-sectional view schematically illustrating a memory device according to an example embodiment.

FIG. 12 is a schematic cross-sectional view of a memory device 100a according to an example embodiment.

Referring to FIG. 12, the memory device 100a may have a cell-on-peri (COP) structure. Thus, the peripheral circuit PC may be between the substrate 110 and the stacked structure SS. The memory device 100a may further include an interlayer insulating layer 120 covering the top surface of the substrate 110 and the peripheral circuit PC, and a second semiconductor layer 131 between the interlayer insulating layer 120 and the first semiconductor layer 132.

Figure 13:
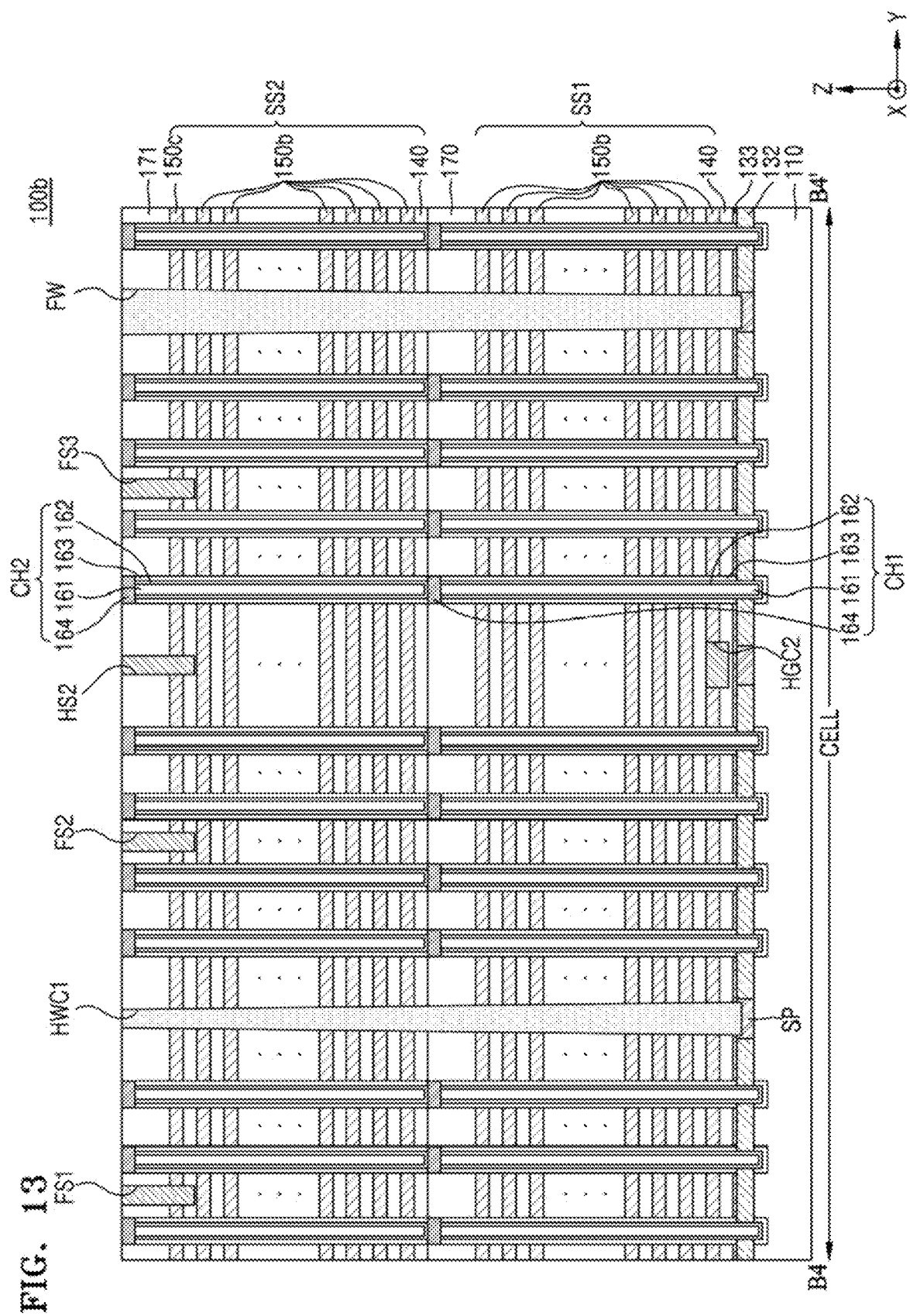
FIG. 13 is a cross-sectional view schematically illustrating a memory device according to an example embodiment.

FIG. 13 is a schematic cross-sectional view of a memory device 100b according to an example embodiment.

Referring to FIG. 13, the memory device 100b may have a multi-stacked structure. The memory device 100b may include the substrate 110, a first stacked structure SS1 on the substrate 110, a second stacked structure SS2 on the first stacked structure SS1. The plurality of first channel structures CH1 may penetrate the first stacked structure SS1, and the plurality of second channel structures CH2 may penetrate the plurality of second stack structures SS2 and overlap the first channel structures CH1 in the vertical direction (Z direction).

The first stacked structure SS1 may include the cell region discontinuous bottom cutout HGC2 that cuts only at least one bottom gate layer 150a, and the second stacked structure SS2 may include the continuous top cutouts (FS1 through FS3) and the discontinuous top cutout HS2 that cut only at least one top gate layer 150c. The cell region discontinuous cutout HWC1 and the continuous cutout FW may cut the gate layers (150a and 150b) of the first stacked structure SS1 and the gate layers (150b and 150c) of the second stacked structure SS2. A first interlayer insulating layer 170 may be between the first stacked structure SS1 and the second stacked structure SS2, and a second interlayer insulating layer 171 may be on the second stacked structure SS2.

FIGS. 14A through 14K are cross-sectional views illustrating a manufacturing method of a memory device, according to an example embodiment. Lines B4-B4' in FIGS. 14A through 14K correspond to the lines B4-B4' in FIG. 4A.

Figure 14A:
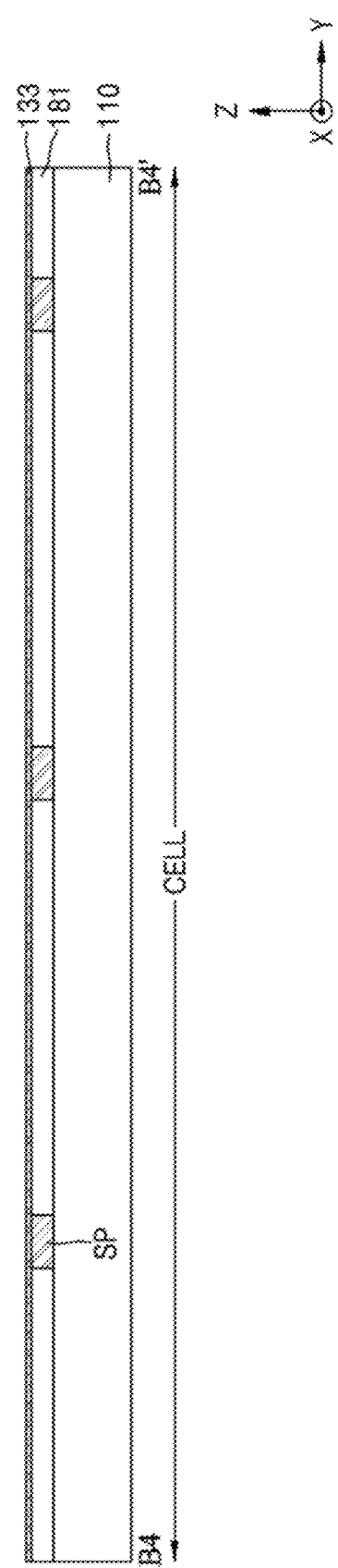
FIGS. 14A through 14K are cross-sectional views illustrating a method of manufacturing a memory device, according to an example embodiment.

Referring to FIG. 14A, the sacrificial layer 181, the plurality of support patterns SP surrounded by the sacrificial layer 181, and the etch stop layer 133 on the sacrificial layer 181 may be formed on the substrate 110. The sacrificial layer 181 may include a material having a high etching selectivity with respect to the etch stop layer 133. The sacrificial layer 181 may include, for example, silicon nitride. In an example embodiment, the plurality of support patterns SP and the etch stop layer 133 may be integrally formed at the same time.

Figure 14B:
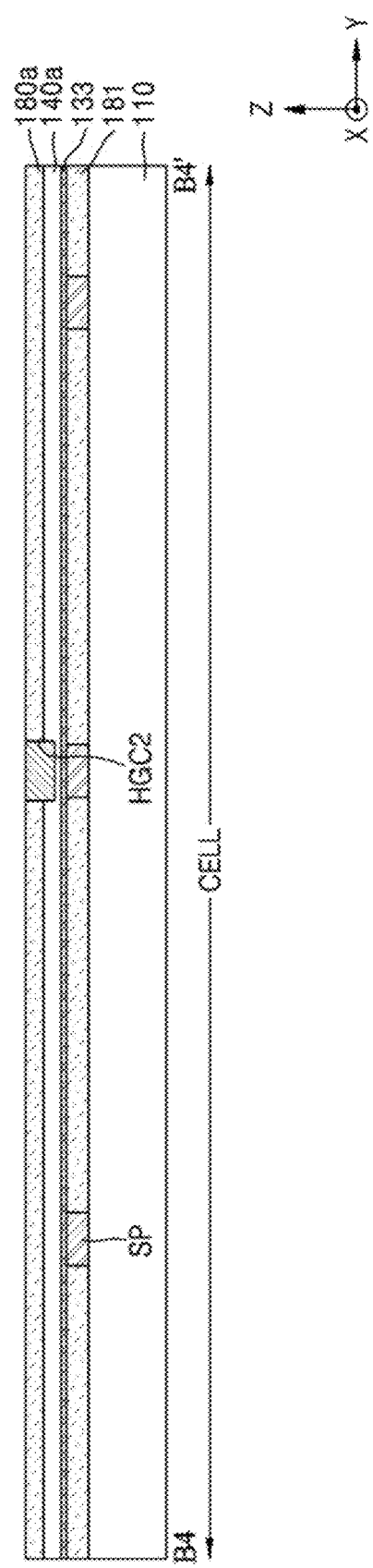

Referring to FIG. 14B, the first interlayer insulating layer 140a and the first sacrificial layer 180a may be formed on the etch stop layer 133. The first sacrificial layer 180a may include a material having a high etching selectivity with respect to the first interlayer insulating layer 140a, for example, silicon nitride. Next, the cell region discontinuous bottom cutouts (HGC1 and HGC2, refer to FIGS. 4A through 4C) and the connection region discontinuous bottom cutouts (HGE1 and HGE2, refer to FIGS. 8A and 8B) that cut the first sacrificial layer 180a may be formed. Next, the cell region discontinuous bottom cutouts (HGC1 and HGC2, refer to FIGS. 4A through 4C) and the connection region discontinuous bottom cutouts (HGE1 and HGE2, refer to FIGS. 8A and 8B) may be filled with an insulating material.

Figure 14C:
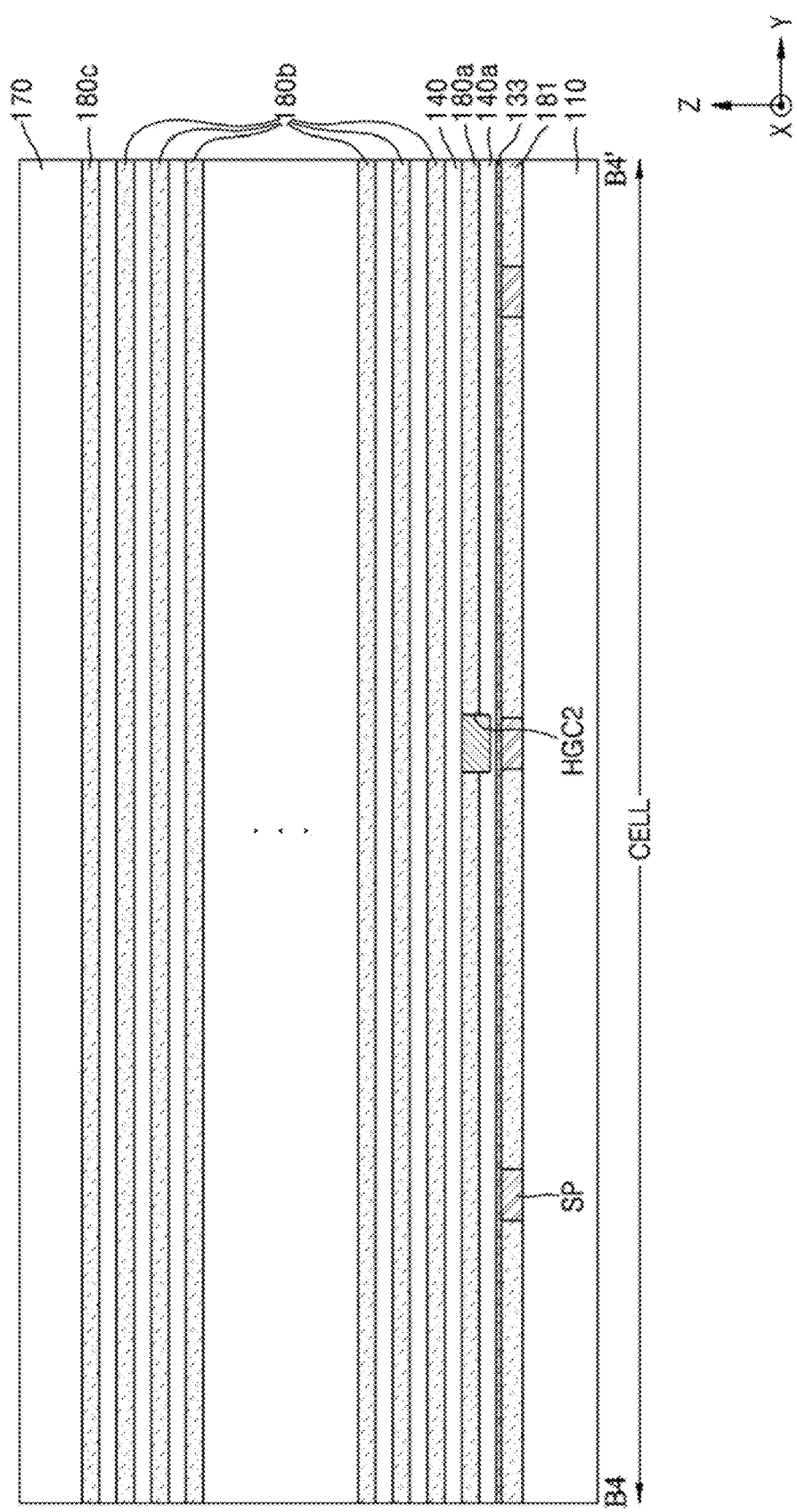

Referring to FIG. 14C, the plurality of interlayer insulating layers 140 and the plurality of sacrificial layers (180b and 180c) may be alternately formed on the first sacrificial layer 180a. The plurality of interlayer insulating layers 140 and the plurality of sacrificial layers (180b and 180c) may be patterned in a step shape as illustrated in FIG. 8C. Then, the interlayer insulating layer 170 may be formed on the top sacrificial layer 180c.

Figure 14D:
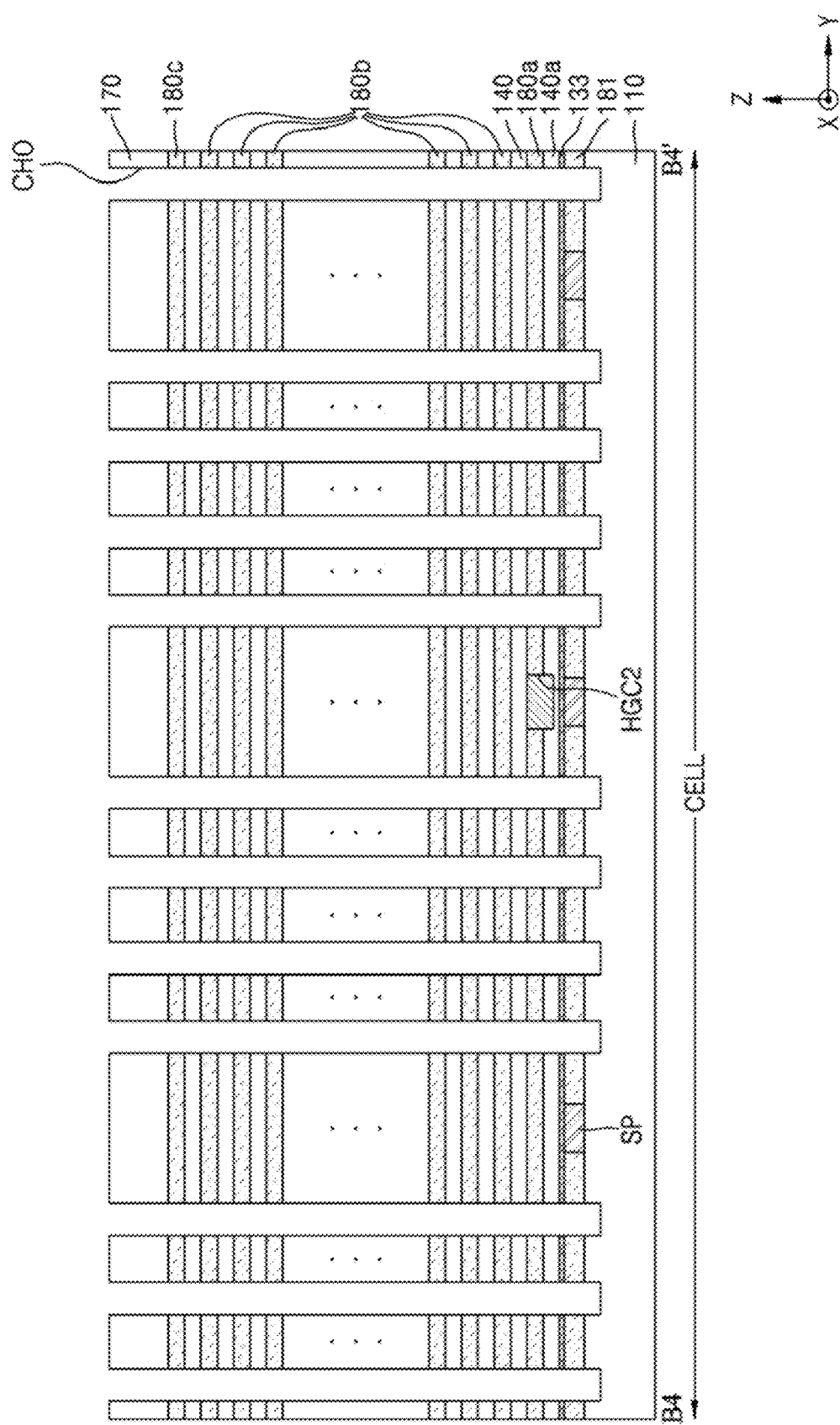

Referring to FIG. 14D, a plurality of channel holes CHO and a plurality of dummy channel holes (not illustrated) that penetrate the plurality of sacrificial layers (180a through 180c and 181), the plurality of interlayer insulating layers (140, 140a, and 170), and the etch stop layer 133 may be formed.

Figure 14E:
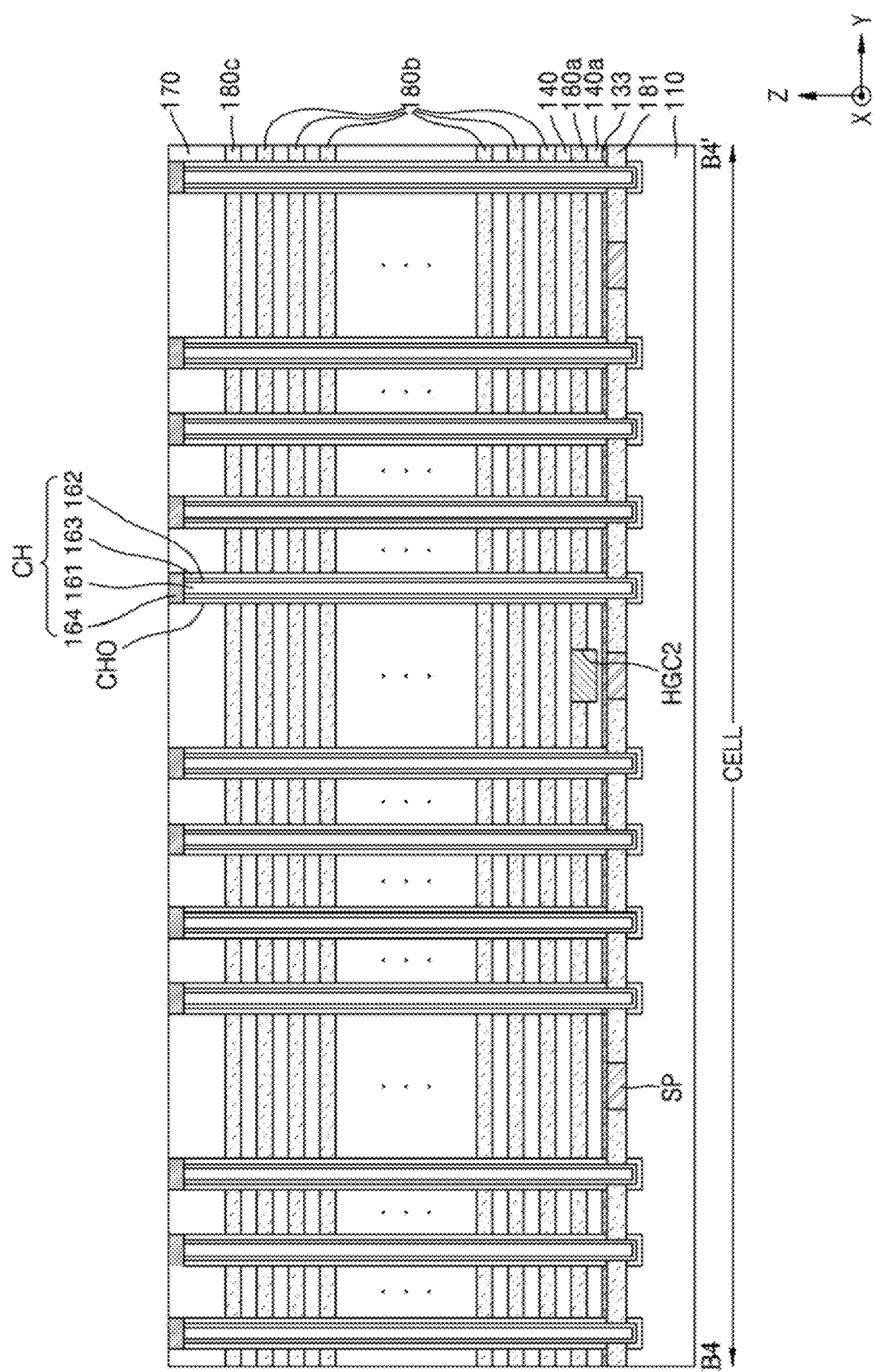

Referring to FIG. 14E, the plurality of channel structures CH may be formed in the plurality of channel holes CHO, and the plurality of dummy channel structures DCH (refer to FIGS. 8A and 8B) may be formed in the plurality of dummy channel holes (not illustrated). For example, a gate insulating layer, a channel layer, and a buried insulating layer may be formed on the plurality of channel holes CHO and the plurality of dummy channel holes (not illustrated). Next, the gate insulating pattern 163, the channel pattern 162, and the buried insulating pattern 161 may be formed by planarizing the gate insulating layer, the channel layer, and the buried insulating layer to expose the interlayer insulating layer 170. Next, A recess may be formed by removing top portions of the gate insulating pattern 163, the channel pattern 162, and the buried insulating pattern 161, a pad layer may be formed on the recess, and the pad pattern 164 may be formed by planarizing the pad layer.

Figure 14F:
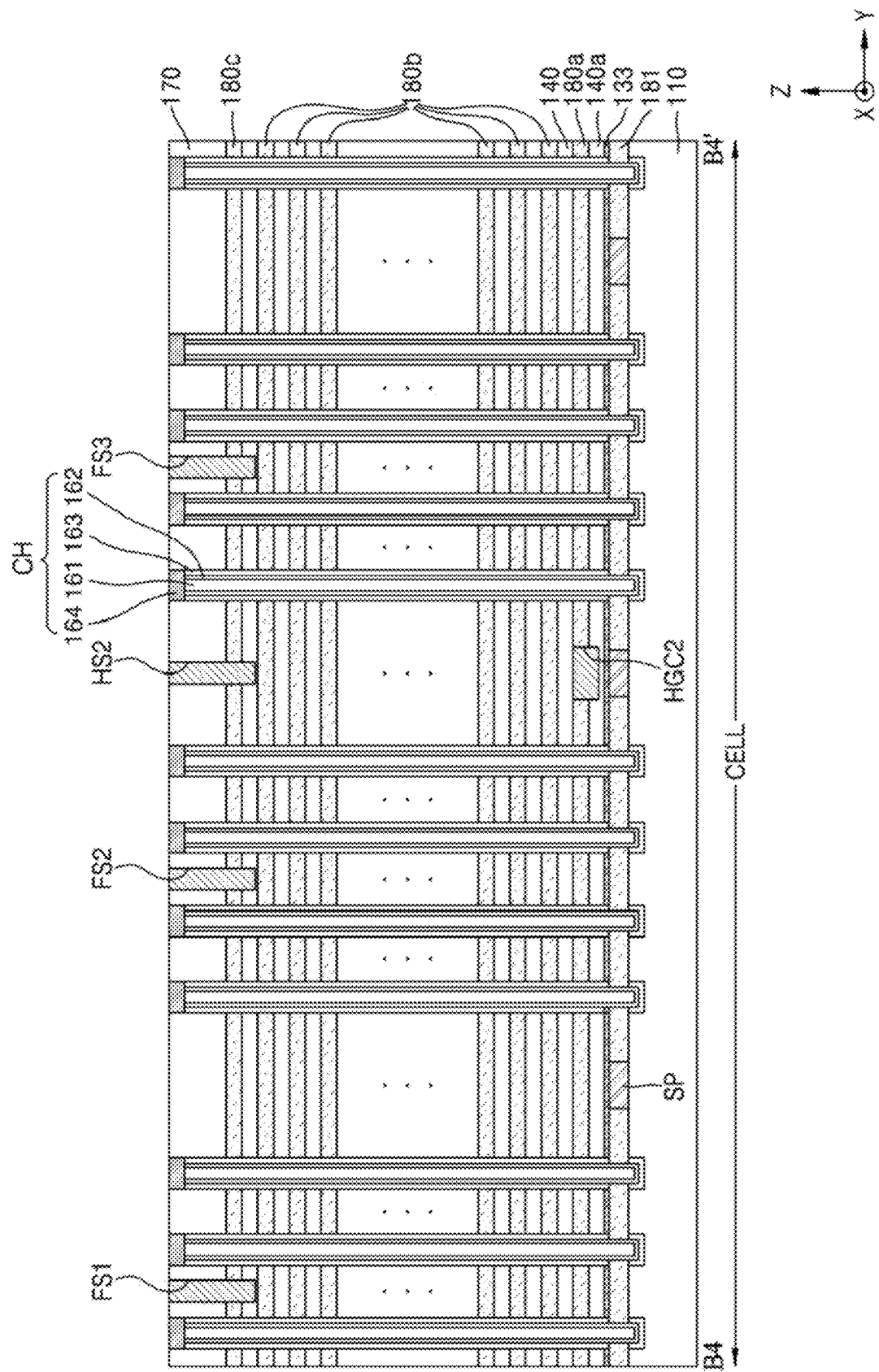

Referring to FIG. 14F, the continuous top cutouts (FS1 through FS3) and the discontinuous top cutouts (HS1 and HS2) (refer to FIGS. 4A and 4B) that cut at least one top sacrificial layer 180c may be formed, and the continuous top cutouts (FS1 through FS3) and the discontinuous top cutouts (HS1 and HS2) may be filled with an insulating material.

Figure 14G:
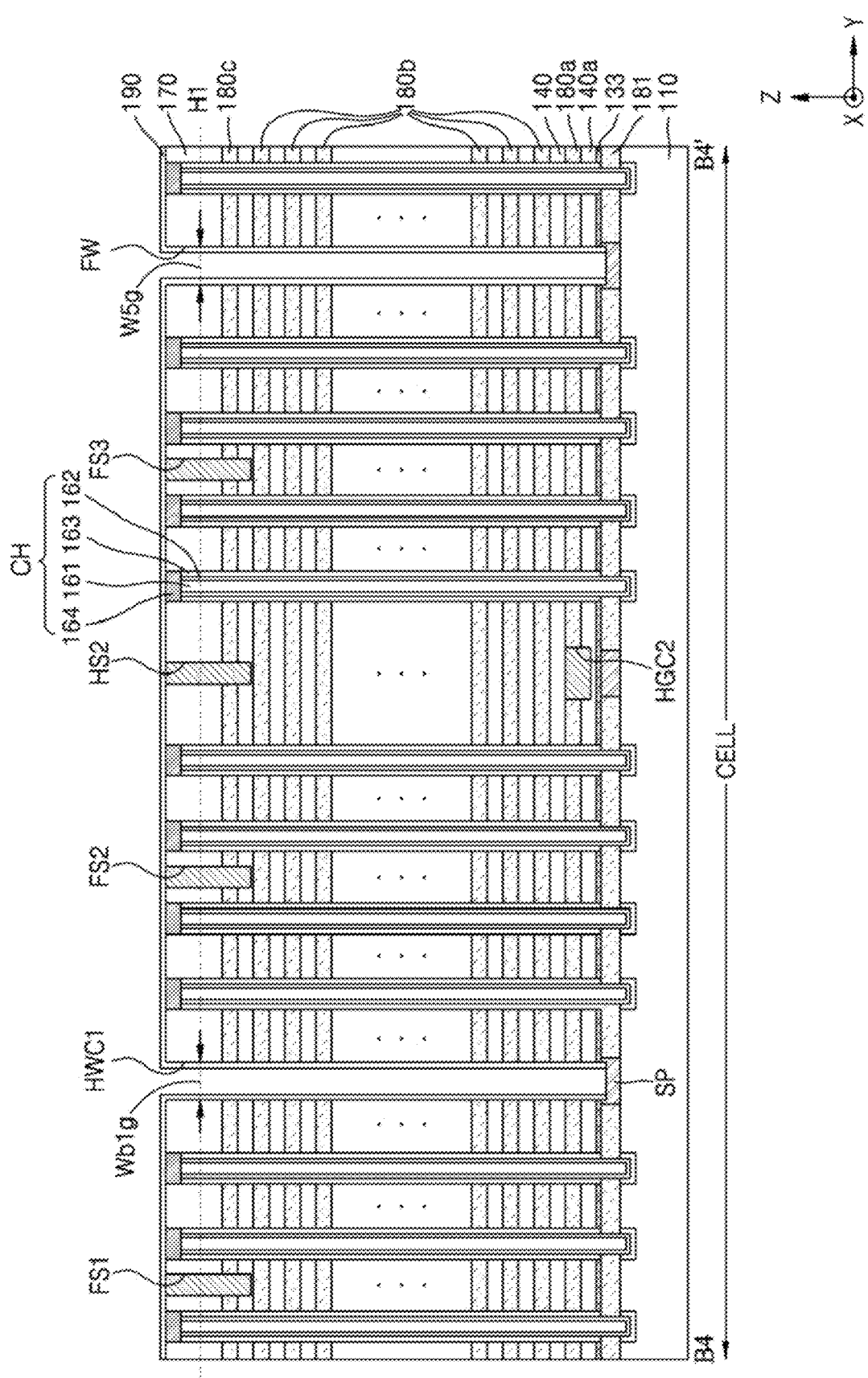

Referring to FIG. 14G, the cell region discontinuous cutouts (HWC1 and HWC2, refer to FIGS. 4A through 4C), the connection region discontinuous cutout (HWE, refer to FIGS. 8A and 8B), the dummy discontinuous cutout (DWE, refer to FIGS. 8A and 8B), and the continuous cutout FW that cut the plurality of sacrificial layers (180a through 180c) may be formed. In an example embodiment, a maximum width Wb1g of the center portion of the cell region discontinuous cutout HWC1 in the second horizontal direction (Y direction) at the first height H1 may be formed substantially the same as a maximum width W5g of the continuous cutout FW in the second horizontal direction (Y direction) at the first height H1.

Although not illustrated in FIG. 14G, referring to FIG. 4D, the cell region discontinuous cutouts (HWC1 and HWC2, refer to FIGS. 4A through 4C), the connection region discontinuous cutout (HWE, refer to FIGS. 8A and 8B), the dummy discontinuous cutout (DWE, refer to 8A and 8B), and the continuous cutout FW may expose a portion of the sacrificial layer 181.

Next, a cover layer 190 may be formed on the sidewalls of the cell region discontinuous cutouts (HWC1 and HWC2, refer to FIGS. 4A through 4C), the connection region discontinuous cutout (HWE, refer to FIGS. 8A and 8B), the dummy discontinuous cutout (DWE, refer to FIGS. 8A and 8B), and the continuous cutout FW. The cover layer 190 may not cover bottoms of the cell region discontinuous cutouts (HWC1 and HWC2, refer to FIGS. 4A through 4C), the connection region discontinuous cutout (HWE, refer to FIGS. 8A and 8B), the dummy discontinuous cutout (DWE, refer to FIGS. 8A and 8B), and the continuous cutout FW. Accordingly, although not illustrated in FIG. 14G, referring to FIG. 4D, the cover layer 190 may expose a portion of the sacrificial layer 181. The cover layer 190 may include a material having a high selectivity with respect to the sacrificial layer 181, for example, a semiconductor material.

Figure 14H:
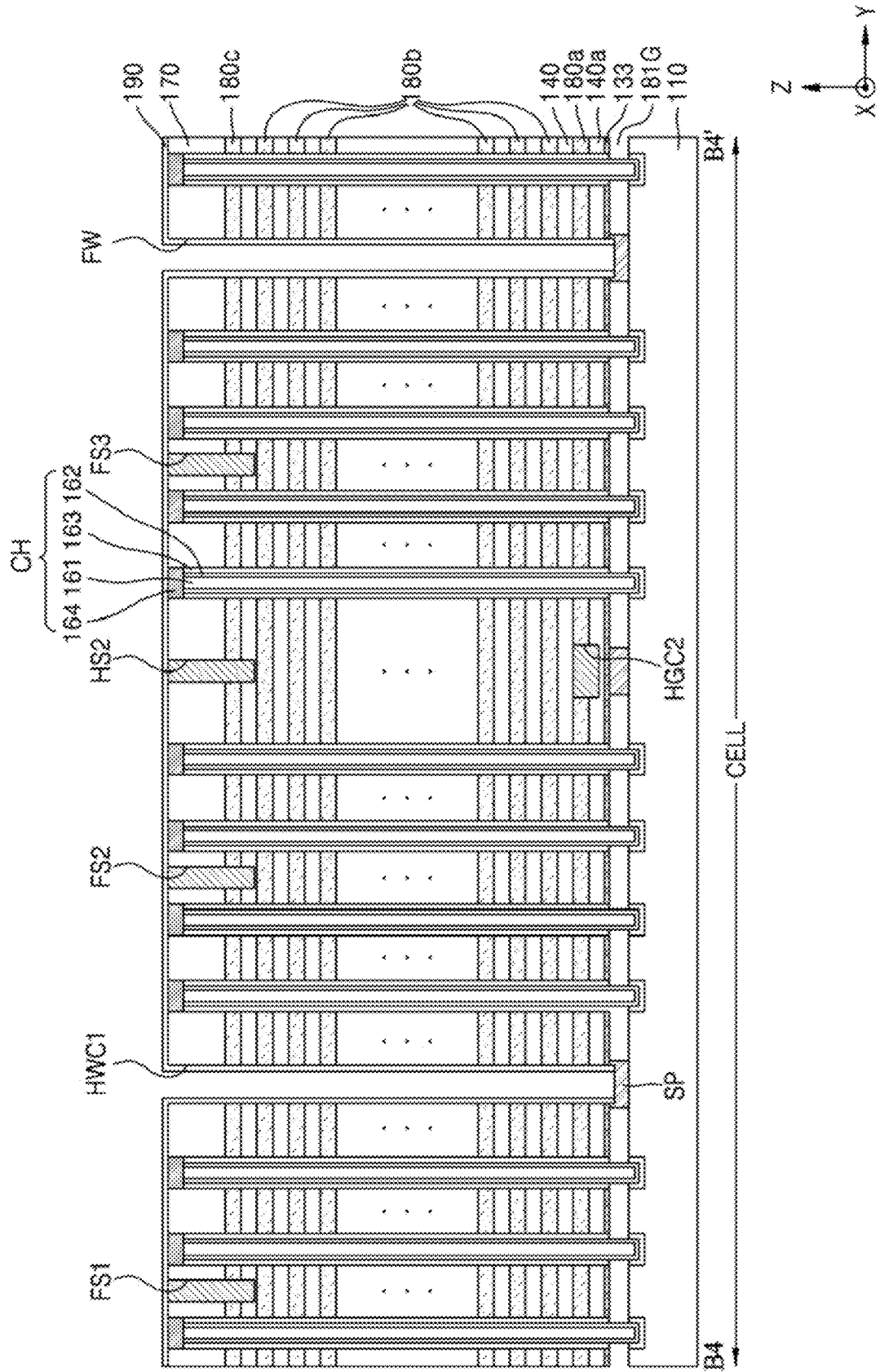

Referring to FIGS. 14G and 14H, the first gap 181G may be formed between the substrate 110 and the etch stop layer 133 by removing the sacrificial layer 181 by using a wet etching or dry etching through the cell region discontinuous cutouts (HWC1 and HWC2, refer to FIGS. 4A through 4C), the connection region discontinuous cutout (HWE, refer to FIGS. 8A and 8B), the dummy discontinuous cutout (DWE, refer to 8A and 8B), and the continuous cutout FW. A portion of sidewalls of the gate insulating pattern 163 of the channel structure CH and the dummy channel structure DCH (refer to FIG. 8B) may be exposed by the first gap 181G. Even when the first gap 181G is formed, the etch stop layer 133, the plurality of interlayer insulating layers 140, and the plurality of sacrificial layers (180a through 180c) may be supported by the plurality of channel structures CH, the plurality of dummy channel structures DCH, and the plurality of support patterns SP and collapse of the plurality of interlayer insulating layers 140, and the plurality of sacrificial layers (180a through 180c) may be prevented Next, a portion of the gate insulating pattern 163 of the channel structure CH and the dummy channel structure DCH (refer to FIG. 8B) that are exposed by the first gap 181G may be removed, and accordingly, a portion of the channel pattern 162 of the channel structure CH and the dummy channel structure DCH (refer to FIG. 8B) may be exposed to the first gap 181G.

Figure 14I:
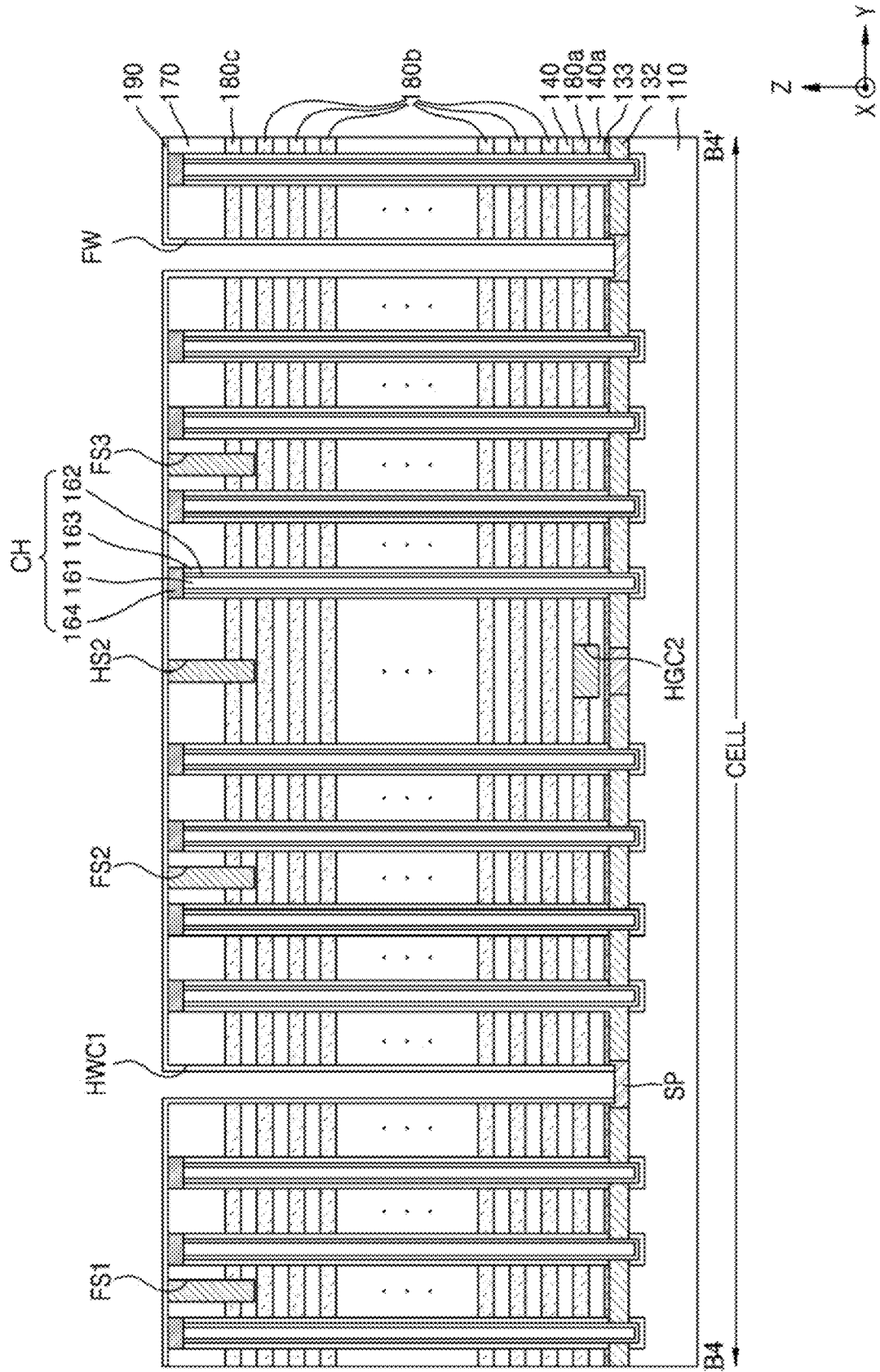

Referring to FIGS. 14H and 14I, the first gap 181G may be filled with the first semiconductor layer 132.

Figure 14J:
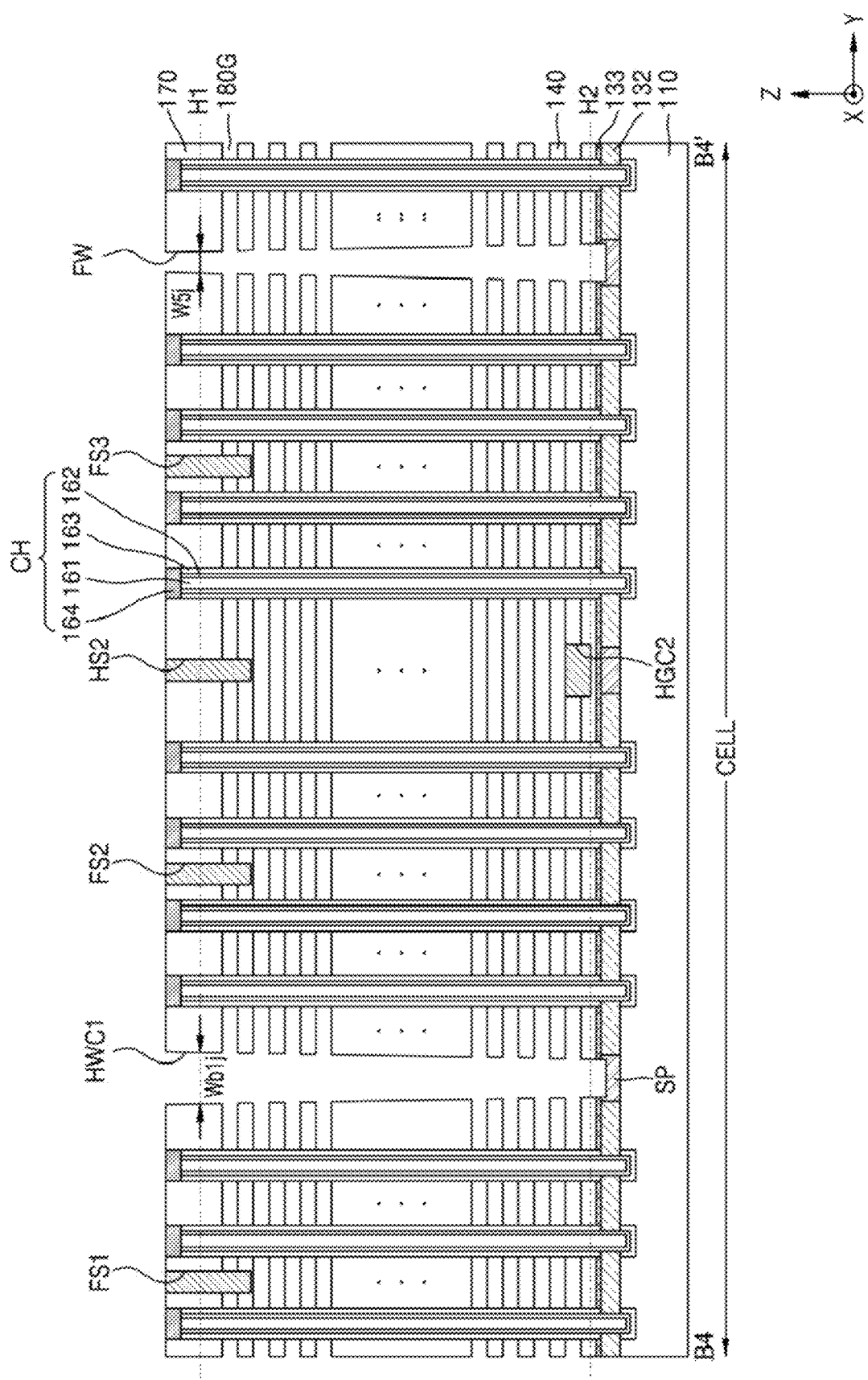

Referring to FIGS. 14I and 14J, a plurality of second gaps 180G between the plurality of interlayer insulating layers 140 may be formed by removing the cover layer 190 and the plurality of sacrificial layers (180a through 180c). While the plurality of sacrificial layers (180a through 180c) are removed, the sidewalls of the cell region discontinuous cutout HWC1 and the continuous cutout FW may become inclined due to an expansion of the plurality of interlayer insulating layers 140. For example, a maximum width Wb1j of the center portion of the cell region discontinuous cutout HWC1 in the second horizontal direction (Y direction) at the first height H1 may become greater than the maximum width Wb1g of the center portion of the cell region discontinuous cutout HWC1 in the second horizontal direction (Y direction) at a time point when the cell region discontinuous cutout HWC1 has been formed in an operation illustrated in FIG. 14G. A maximum width W5j of the continuous cutout FW in the second horizontal direction (Y direction) at the first height H1 may become less than the maximum width W5g of the continuous cutout FW in the second horizontal direction (Y direction) at a time point when the continuous cutout FW has been formed in the operation illustrated in FIG. 14G. Accordingly, the maximum width Wb1j of the center portion of the cell region discontinuous cutout HWC1 in the second horizontal direction (Y direction) at the first height H1 may become greater than the maximum width W5j of the continuous cutout FW in the second horizontal direction (Y direction) at the first height H1.

Figure 14K:
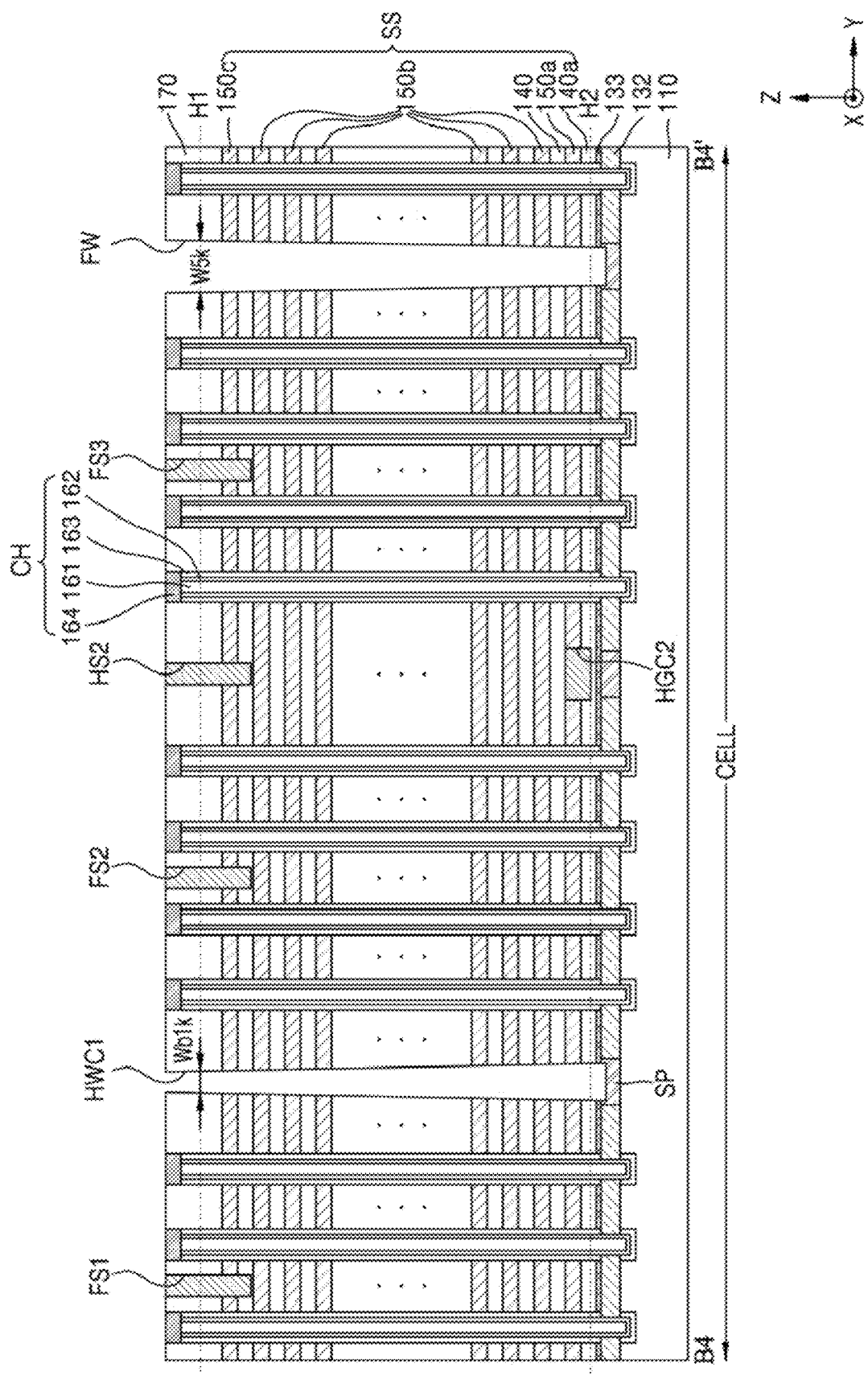

Referring to FIGS. 14J and 14K, the plurality of second gaps 180G may be filled by the plurality of gate layers (150a through 150c), respectively. While the plurality of gate layers (150a through 150c) are formed, the sidewalls of the cell region discontinuous cutout HWC1 and the continuous cutout FW may become inclined due to a contraction of the materials. For example, a maximum width Wb1k of the center portion of the cell region discontinuous cutout HWC1 in the second horizontal direction (Y direction) at the first height H1 may become less than the maximum width Wb1g of the center portion of the cell region discontinuous cutout HWC1 in the second horizontal direction (Y direction) at a time point when the cell region discontinuous cutout HWC1 has been formed in the operation illustrated in FIG. 14G. However, a maximum width W5k of the continuous cutout FW in the second horizontal direction (Y direction) at the first height H1 may become greater than the maximum width W5g of the continuous cutout FW in the second horizontal direction (Y direction) at a time point when the continuous cutout FW has been formed in the operation illustrated in FIG. 14G. Accordingly, the maximum width Wb1k of the center portion of the cell region discontinuous cutout HWC1 in the second horizontal direction (Y direction) at the first height H1 may become less than the maximum width W5k of the continuous cutout FW in the second horizontal direction (Y direction) at the first height H1.

Referring to FIGS. 4A through 4D and 8A through 8C, the cell region discontinuous cutout HWC, the connection region discontinuous cutout HWE, the dummy discontinuous cutout DWE, and the continuous cutout FW may be filled with the insulating material IM. In addition, a plurality of contact plugs CP may be formed to contact the plurality of gate layers (150a through 150c), respectively. As a result, the memory device 100 may be manufactured.

By way of summation and review, as a method of increasing a degree of integration of semiconductor memory devices, three-dimensional (3D) semiconductor memory devices may be formed in which memory cells are stacked in a vertical direction. As the number of memory cells stacked in the vertical direction is increased to improve the degree of integration degree of the 3D semiconductor memory devices, manufacturing of the memory devices may present challenges.

As described above, embodiments relate to a three-dimensional semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory device, comprising:
   a substrate;
   a stacked structure including a plurality of gate layers and a plurality of interlayer insulating layers that are alternately stacked on the substrate in a vertical direction, the stacked structure including a cell region and a connection region, the connection region of the stacked structure having a stepped shape in a first horizontal direction and a second horizontal direction; and a plurality of channel structures in the cell region of the stacked structure, the channel structures extending in the vertical direction to penetrate the plurality of gate layers, wherein:

the stacked structure includes:
- a continuous cutout that continuously cuts the plurality of gate layers in the first horizontal direction in the connection region of the stacked structure;
- a first row of dummy discontinuous cutouts that discontinuously cut the plurality of gate layers in the first horizontal direction and are spaced apart from the continuous cutout in the second horizontal direction;
- a first row of connection region discontinuous cutouts that discontinuously cut the plurality of gate layers in the first horizontal direction and are spaced apart from the first row of dummy discontinuous cutouts in the second horizontal direction; and
- a second row of dummy discontinuous cutouts that discontinuously cut the plurality of gate layers in the first horizontal direction and are spaced apart from the first row of connection region discontinuous cutouts in the second horizontal direction, and in a plan view, an end portion of the first row of dummy discontinuous cutouts is spaced apart from an end portion of the first row of connection region discontinuous cutouts in a diagonal direction extending between the first horizontal direction and the second horizontal direction.

2. The memory device as claimed in claim 1, wherein:
in the plan view, the end portion of the first row of connection region discontinuous cutouts is spaced apart from an end portion of the second row of dummy discontinuous cutouts in the first horizontal direction, and in the plan view, the end portion of the second row of dummy discontinuous cutouts is aligned with the end portion of the first row of dummy discontinuous cutouts in the first horizontal direction.

3. The memory device as claimed in claim 1, wherein the stacked structure further includes:
- a second row of connection region discontinuous cutouts that discontinuously cut the plurality of gate layers in the first horizontal direction and are spaced apart from the second row of dummy discontinuous cutouts in the second horizontal direction; and
- a third row of dummy discontinuous cutouts that discontinuously cut the plurality of gate layers in the first horizontal direction and are spaced apart from the second row of connection region discontinuous cutouts in the second horizontal direction.

4. The memory device as claimed in claim 3, wherein:
in the plan view, an end portion of the second row of connection region discontinuous cutouts is spaced apart from an end portion of the second row of dummy discontinuous cutouts in the diagonal direction, and in the plan view, an end portion of the third row of dummy discontinuous cutouts is aligned with the end portion of the second row of dummy discontinuous cutouts in the first horizontal direction.

5. The memory device as claimed in claim 3, wherein:
a gap between two neighboring cutouts in the second row of dummy discontinuous cutouts is aligned with a gap between two neighboring cutouts in the first row of dummy discontinuous cutouts in the second horizontal direction, and a gap between two neighboring cutouts in the third row of dummy discontinuous cutouts is aligned with the gap between two neighboring cutouts in the second row of dummy discontinuous cutouts in the second horizontal direction.

6. The memory device as claimed in claim 3, wherein a gap between two neighboring cutouts in the second row of connection region discontinuous cutouts is aligned with a gap between two neighboring cutouts in the first row of connection region discontinuous cutouts in the second horizontal direction.

7. The memory device as claimed in claim 1, further comprising:
- a plurality of dummy channel structures in the connection region of the stacked structure, the dummy channel structures extending in the vertical direction to penetrate the plurality of gate layers; and
- a plurality of contact plugs on the plurality of gate layers in the connection region of the stacked structure.

8. The memory device as claimed in claim 7, wherein, in the plan view, a first contact plug of the plurality of contact plugs is surrounded by four dummy channel structures among the plurality of dummy channel structures.

9. The memory device as claimed in claim 1, further comprising an insulating layer disposed in the continuous cutout, the first row of dummy discontinuous cutouts, the first row of connection region discontinuous cutouts, and the second row of dummy discontinuous cutouts.

10. The memory device as claimed in claim 1, wherein the continuous cutout extends to the cell region of the stacked structure.

11. A memory device, comprising:
a substrate;
a stacked structure including a plurality of gate layers and a plurality of interlayer insulating layers that are alternately stacked on the substrate in a vertical direction, the stacked structure including a cell region and a connection region, the connection region of the stacked structure having a stepped shape in a first horizontal direction and a second horizontal direction; and
a plurality of channel structures in the cell region of the stacked structure, the channel structures extending in the vertical direction to penetrate the plurality of gate layers, wherein:

the stacked structure includes:
- a continuous cutout that continuously cuts the plurality of gate layers in the first horizontal direction in the connection region of the stacked structure;
- a plurality of dummy discontinuous cutouts that discontinuously cut the plurality of gate layers in the first horizontal direction and are spaced apart from the continuous cutout in the second horizontal direction; and
- a plurality of connection region discontinuous cutouts that discontinuously cut the plurality of gate layers in the first horizontal direction and are spaced apart from the continuous cutout in the second horizontal direction, the plurality of dummy discontinuous cutouts and the plurality of connection region discontinuous cutouts are alternately arranged in the second horizontal direction, end portions of the plurality of dummy discontinuous cutouts are disposed at a first position in the first horizontal direction, end portions of the plurality of connection region discontinuous cutouts are disposed at a second position in the first horizontal direction, the second position is spaced apart from the first position in the first horizontal direction, and in a plan view, the end portions of the plurality of dummy discontinuous cutouts and the end portions of the plurality of connection region discontinuous cutouts are arranged in a zigzag pattern.

12. The memory device as claimed in claim 11, wherein the plurality of dummy discontinuous cutouts includes:

a first row of dummy discontinuous cutouts that discontinuously cut the plurality of gate layers in the first horizontal direction and are spaced apart from the continuous cutout in the second horizontal direction;

a second row of dummy discontinuous cutouts that discontinuously cut the plurality of gate layers in the first horizontal direction and are spaced apart from the first row of dummy discontinuous cutouts in the second horizontal direction; and a third row of dummy discontinuous cutouts that discontinuously cut the plurality of gate layers in the first horizontal direction and are spaced apart from the second row of dummy discontinuous cutouts in the second horizontal direction.

13. The memory device as claimed in claim 12, wherein the plurality of connection region discontinuous cutouts includes:

a first row of connection region discontinuous cutouts that discontinuously cut the plurality of gate layers in the first horizontal direction and are between the first row of dummy discontinuous cutouts and the second row of dummy discontinuous cutouts; and a second row of connection region discontinuous cutouts that discontinuously cut the plurality of gate layers in the first horizontal direction and are between the second row of dummy discontinuous cutouts and the third row of dummy discontinuous cutouts.

14. The memory device as claimed in claim 13, wherein, in the plan view, an end portion of the first row of connection region discontinuous cutouts is spaced apart from an end portion of the first row of dummy discontinuous cutouts in the first horizontal direction.

15. The memory device as claimed in claim 13, wherein:

a gap between two neighboring cutouts in the second row of dummy discontinuous cutouts is aligned with a gap between two neighboring cutouts in the first row of dummy discontinuous cutouts in the second horizontal direction, and a gap between two neighboring cutouts in the third row of dummy discontinuous cutouts is aligned with the gap between two neighboring cutouts in the second row of dummy discontinuous cutouts in the second horizontal direction.

16. The memory device as claimed in claim 13, wherein a gap between two neighboring cutouts in the second row of connection region discontinuous cutouts is aligned with a gap between two neighboring cutouts in the first row of connection region discontinuous cutouts in the second horizontal direction.

17. The memory device as claimed in claim 11, further comprising:

a plurality of dummy channel structures in the connection region of the stacked structure, the dummy channel structures extending in the vertical direction to penetrate the plurality of gate layers; and a plurality of contact plugs on the plurality of gate layers in the connection region of the stacked structure.

18. The memory device as claimed in claim 17, wherein, in the plan view, a first contact plug of the plurality of contact plugs is surrounded by four dummy channel structures among the plurality of dummy channel structures.

19. The memory device as claimed in claim 11, further comprising an insulating layer disposed in the continuous cutout, the plurality of dummy discontinuous cutouts, and the plurality of connection region discontinuous cutouts.

20. The memory device as claimed in claim 11, wherein the continuous cutout extends to the cell region of the stacked structure.

\* \* \* \* \*